United States Patent
Tsuzuki et al.

(10) Patent No.: US 7,492,075 B2
(45) Date of Patent: Feb. 17, 2009

(54) MULTILAYER PIEZOELECTRIC ELEMENT, FUEL INJECTOR HAVING THE PIEZOELECTRIC ELEMENT AND PIEZOELECTRIC ELEMENT PRODUCTION METHOD

(75) Inventors: Masashi Tsuzuki, Nagoya (JP); Hideki Ishikawa, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 122 days.

(21) Appl. No.: 11/386,826

(22) Filed: Mar. 23, 2006

(65) Prior Publication Data

US 2006/0214541 A1 Sep. 28, 2006

(30) Foreign Application Priority Data

Mar. 24, 2005 (JP) ............................. 2005-085716
Feb. 7, 2006 (JP) ............................. 2006-030157

(51) Int. Cl.
*H01L 41/08* (2006.01)
(52) U.S. Cl. ....................... 310/328; 310/366
(58) Field of Classification Search ............... 310/328, 310/366
See application file for complete search history.

(56) References Cited

U.S. PATENT DOCUMENTS

| | | | |
|---|---|---|---|
| 4,553,059 A | | 11/1985 | Abe et al. |
| 5,148,077 A | * | 9/1992 | Grawey et al. .............. 310/328 |
| 5,455,477 A | * | 10/1995 | Sano et al. .................. 310/328 |
| 5,477,102 A | * | 12/1995 | Miyoshi ...................... 310/344 |
| 6,265,810 B1 | | 7/2001 | Ngo |
| 6,274,967 B1 | * | 8/2001 | Zumstrull et al. ........... 310/328 |
| 6,316,863 B1 | * | 11/2001 | Schuh et al. ................ 310/328 |
| 6,345,803 B2 | * | 2/2002 | Sakurai ................. 251/129.06 |
| 6,563,687 B2 | | 5/2003 | Kawazoe et al. |
| 6,787,975 B2 | | 9/2004 | Kobayashi et al. |
| 6,873,089 B2 | | 3/2005 | Kobayashi et al. |
| 2002/0163282 A1 | | 11/2002 | Heinz |
| 2003/0085634 A1 | | 5/2003 | Leo et al. |
| 2005/0046310 A1 | | 3/2005 | Kobayashi et al. |

FOREIGN PATENT DOCUMENTS

| | | |
|---|---|---|
| DE | 101 33 151 A1 | 1/2003 |
| EP | 0 485 995 A1 | 5/1992 |
| EP | 1 172 552 A1 | 1/2002 |
| JP | 4-30482 A | 2/1992 |
| JP | 7-30163 A | 1/1995 |

(Continued)

OTHER PUBLICATIONS

Chinese Office Action dated Mar. 21, 2008 for corresponding Chinese Patent Application No. 200610068038.8.

*Primary Examiner*—Mark Budd
(74) *Attorney, Agent, or Firm*—Sughrue Mion, PLLC

(57) ABSTRACT

A multilayer piezoelectric element includes at least one piezoelectric layer unit having sintered piezoelectric ceramic and electrode layers alternately stacked together in a first direction and a positioning member that, when the at least one piezoelectric layer unit is placed in an enclosing member in such a manner that the enclosing member encloses therewith a periphery of the at least one piezoelectric layer unit along a second direction perpendicular to the first direction, controls the position of the at least one piezoelectric layer unit within the enclosing member along the second direction.

17 Claims, 16 Drawing Sheets

FOREIGN PATENT DOCUMENTS

| | | |
|---|---|---|
| JP | 2000-269562 | 9/2000 |
| JP | 2000-269562 A | 9/2000 |
| JP | 2002-54527 A | 2/2002 |
| JP | 2002-256999 A | 9/2002 |
| JP | 2003-224313 A | 8/2003 |
| JP | 2004-297043 A | 10/2004 |

* cited by examiner

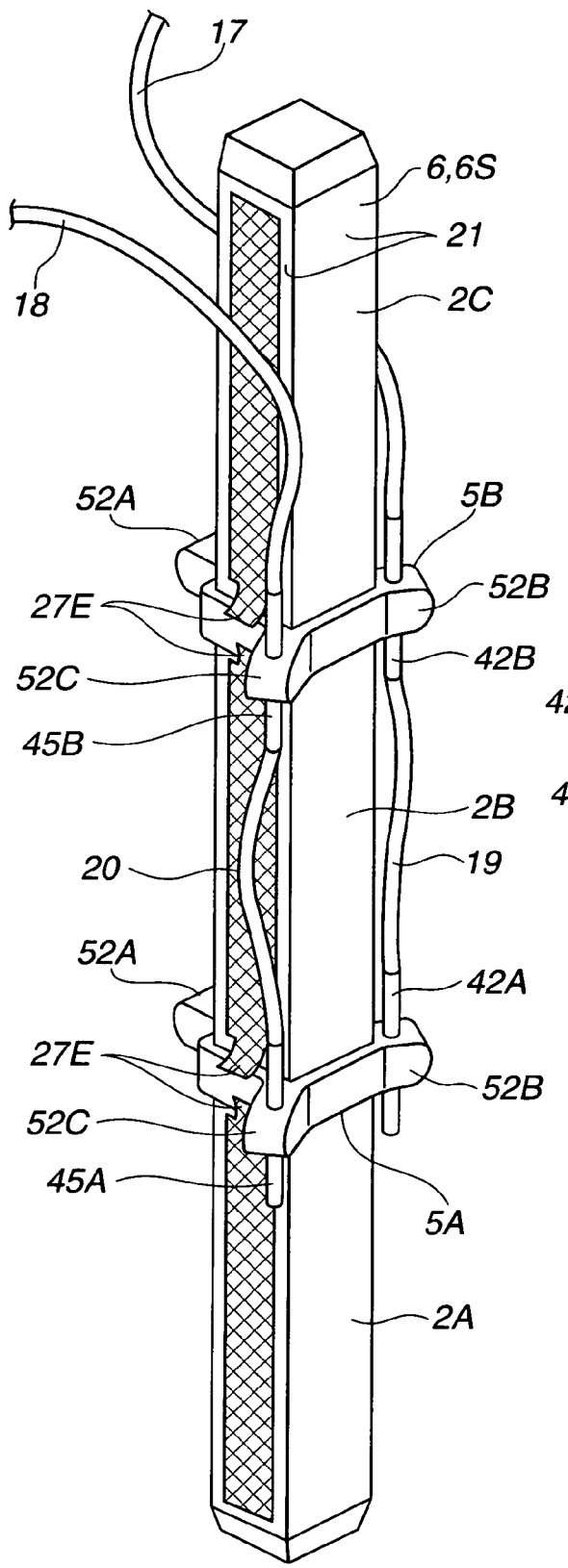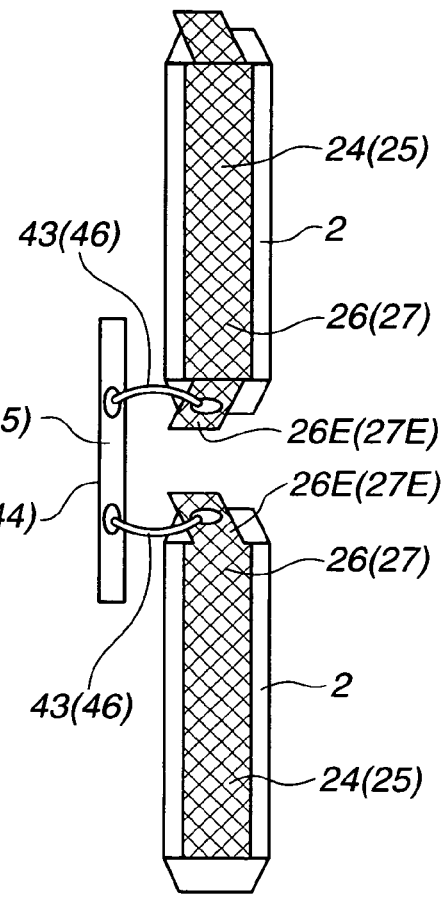
FIG.9A
FIG.9B

FIG.12A FIG.12B
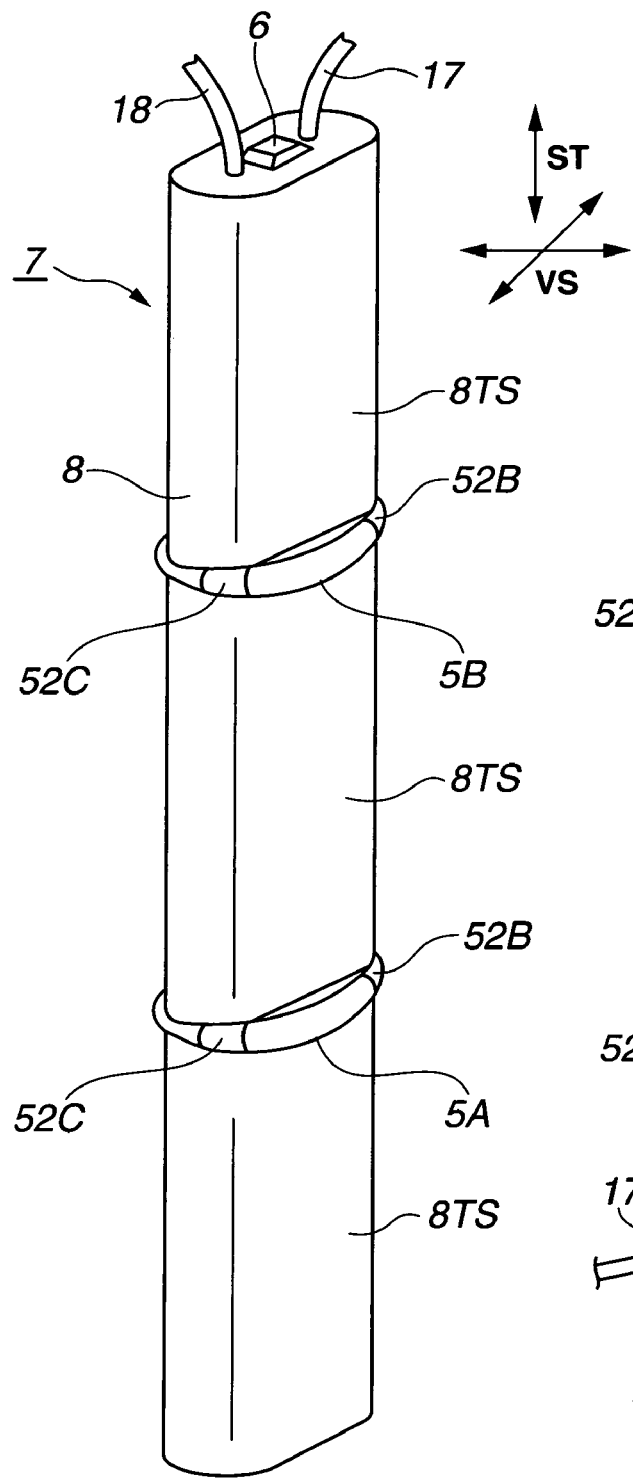
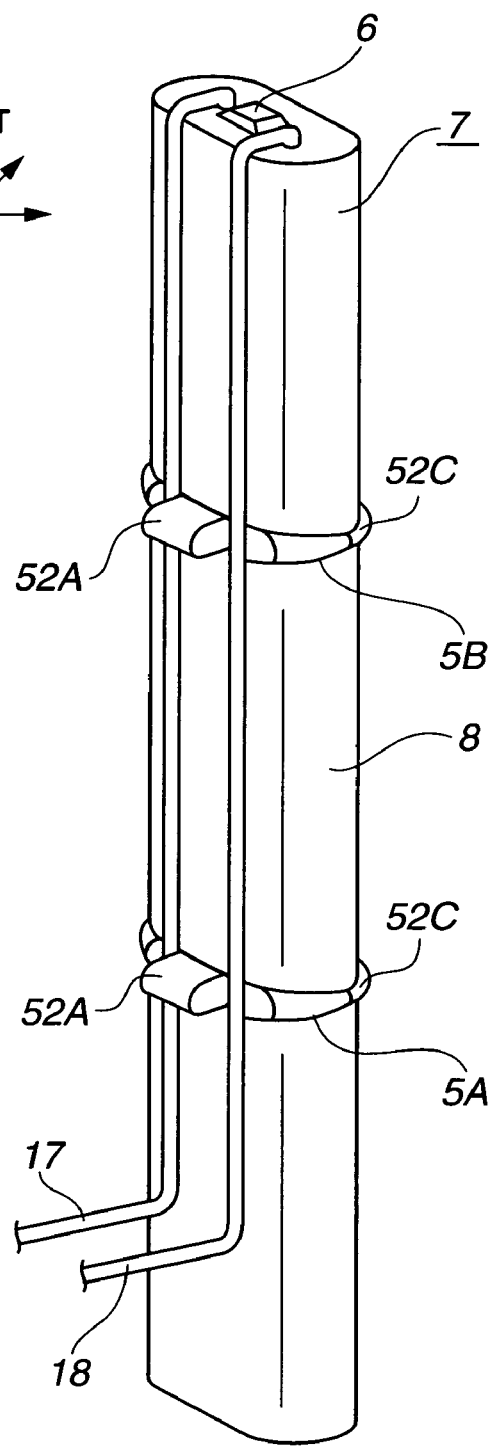

MULTILAYER PIEZOELECTRIC ELEMENT, FUEL INJECTOR HAVING THE PIEZOELECTRIC ELEMENT AND PIEZOELECTRIC ELEMENT PRODUCTION METHOD

BACKGROUND OF THE INVENTION

The present invention relates to a multilayer piezoelectric element, a fuel injectors having the multilayer piezoelectric element and a method for producing the multilayer piezoelectric element.

Japanese Laid-Open Patent Publication No. 2000-269562 proposes a multilayer piezoelectric element that includes a piezoelectric layer unit having sintered piezoelectric ceramic layers and electrode layers alternately stacked together or a plurality of such piezoelectric layer units assembled in the direction of layer stacking. This type of multilayer piezoelectric element is suitably used as a sensor element to detect vibrations or pressure changes or used as a piezoelectric actuator to cause a displacement or vibrations through the application of a direct-current voltage or an alternating-current voltage. The piezoelectric actuator is fit for a wide range of uses such as an ultrasonic motor, a fuel injector and a precision positioning device.

In order to obtain a high output from the multilayer piezoelectric element, it is conceivable to provide a large number of piezoelectric ceramic layers and electrode layers in the piezoelectric layer unit and/or to provide a large number of piezoelectric layer units in the unit assembly.

SUMMARY OF THE INVENTION

In such a case, however, the piezoelectric layer unit or unit assembly increases in dimension along the direction of layer stacking so that the cross sectional area of the piezoelectric layer unit or unit assembly in a direction perpendicular to the layer stacking direction becomes relatively small. There thus arises a possibility that the piezoelectric layer unit or unit assembly will be curved and buckled when the piezoelectric element experiences an external force in the layer stacking direction during its operation.

It is therefore an object of the present invention to provide a multilayer piezoelectric element having a piezoelectric layer unit or unit assembly protected from curving and buckling, even when experiencing an external force during its operation, so as to achieve high reliability and durability.

It is also an object of the present invention to provide a fuel injector using the multilayer piezoelectric element and a method of producing the multilayer piezoelectric element.

According to a first aspect of the present invention, there is provided a multilayer piezoelectric element, comprising: at least one piezoelectric layer unit having sintered piezoelectric ceramic and electrode layers alternately stacked together in a first direction; a casing member that encloses therewith a periphery of said at least one piezoelectric layer unit along a second direction perpendicular to the first direction; and a positioning member that controls the position of said at least one piezoelectric layer unit within the enclosing member along the second direction.

According to a second aspect of the present invention, there is provided a multilayer piezoelectric element, comprising: at least one piezoelectric layer unit having sintered piezoelectric ceramic and electrode layers alternately stacked together in a first direction; and a positioning member that, when the at least one piezoelectric layer unit is placed in an enclosing member in such a manner that the enclosing member encloses therewith a periphery of the at least one piezoelectric layer unit along a second direction perpendicular to the first direction, controls the position of the at least one piezoelectric layer unit within the enclosing member along the second direction.

According to a third aspect of the present invention, there is provided a fuel injector comprising: a multilayer piezoelectric element that includes at least one piezoelectric layer unit having sintered piezoelectric ceramic layers and electrode layers alternately stacked in a first direction; an enclosing member that encloses therewith a periphery of the at least one piezoelectric layer unit along a second direction perpendicular to the first direction; and a positioning member that controls the position of the at least one piezoelectric layer unit within the enclosing member along the second direction.

According to a fourth aspect of the present invention, there is provided a method of producing a multilayer piezoelectric element, comprising: providing at least one piezoelectric layer unit having sintered piezoelectric ceramic layers and electrode layers alternately stacked together in a first direction; attaching a positioning member to the at least one piezoelectric layer unit to form a unit assembly; and inserting the unit assembly into an enclosing member in such a manner as that the enclosing member encloses therewith a periphery of the unit assembly along a second direction perpendicular to the first direction, while allowing the positioning member to control the position of the at least one piezoelectric layer unit within the enclosing member along the second direction.

According to a fifth aspect of the present invention, there is provided a method of producing a multilayer piezoelectric element, comprising: providing piezoelectric layer units each having sintered piezoelectric ceramic layers and electrode layers alternately stacked together in a first direction; stacking the piezoelectric layer units together in the first direction with an uncured adhesive material being interposed between opposing end surfaces of adjacent ones of the piezoelectric layer units; curing the adhesive material to bond the piezoelectric layer units together; and arranging a positioning member on the piezoelectric layer units in such a manner that, when the piezoelectric layer units are placed in an enclosing member so that the enclosing member encloses therewith peripheries of the piezoelectric layer units along a second direction perpendicular to the first direction, the positioning member controls the positions of the piezoelectric layer units within the enclosing member along the second direction, wherein the stacking includes inserting the piezoelectric layer units and the positioning member in an assembling jig in such a manner that the assembling jig encloses therewith peripheries of the piezoelectric layer units along the second direction, while allowing the positioning member to control the positions of the piezoelectric layer units within the assembling jig along the second direction.

According to a sixth aspect of the present invention, there is provided a method of producing a multilayer piezoelectric element, comprising: providing at least one piezoelectric layer unit having sintered piezoelectric ceramic layers and electrode layers alternately stacked in a first direction; attaching a positioning member to the at least one piezoelectric layer unit in such a manner that, when the at least one piezoelectric layer unit is placed in an enclosing member so that the enclosing member encloses therewith a periphery of the at least one piezoelectric layer unit along a second direction perpendicular to the first direction, the positioning member controls the position of the at least one piezoelectric layer unit within the enclosing member along the second direction; and forming a resin mold member around the periphery of the at least one piezoelectric layer unit along the second direction, wherein the forming includes: inserting the at least one piezoelectric layer unit and the positioning member in a molding jig, while allowing the positioning member to control the position of the at least one piezoelectric layer unit within the molding jig along the second direction; and molding a resinous material into a space between an outer surface of the at least one piezoelectric layer unit and an inner surface of the molding jig.

The other objects and features of the present invention will also become understood from the following description.

BRIEF DESCRIPTION OF THE DRAWINGS

FIG. 9A is a schematic view of the piezoelectric layer unit assembly with an electrical wiring arrangement according to the first and second embodiments of the present invention.

FIG. 9B is a schematic view showing electrical connection between two adjacent piezoelectric units according to the first and second embodiments of the present invention.

FIGS. 12A and 12B are perspective views of the resin-molded piezoelectric layer unit assembly with external leads being straightened out and laid along the resin mold, respectively, according to the first and second embodiments of the present invention.

DESCRIPTION OF THE EMBODIMENTS

Figure 1:
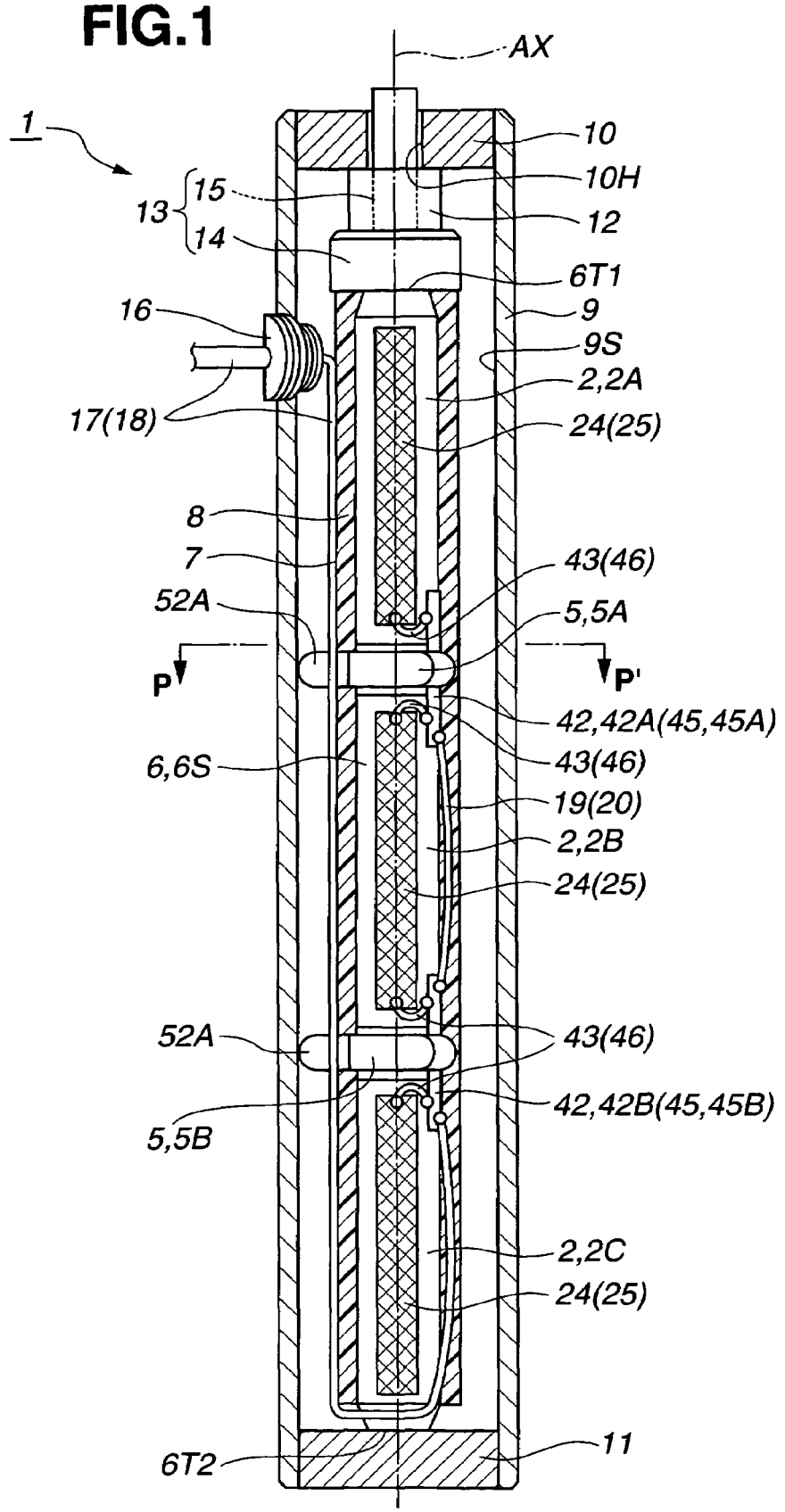
FIG. 1 is a sectional view of a multilayer piezoelectric element according to a first embodiment of the present invention.

The present invention will be described in detail below by way of the following first though seventh embodiments, in which like parts and portions are designated by like reference numerals to avoid repeated explanations thereof.

First Embodiment

Figure 3A:
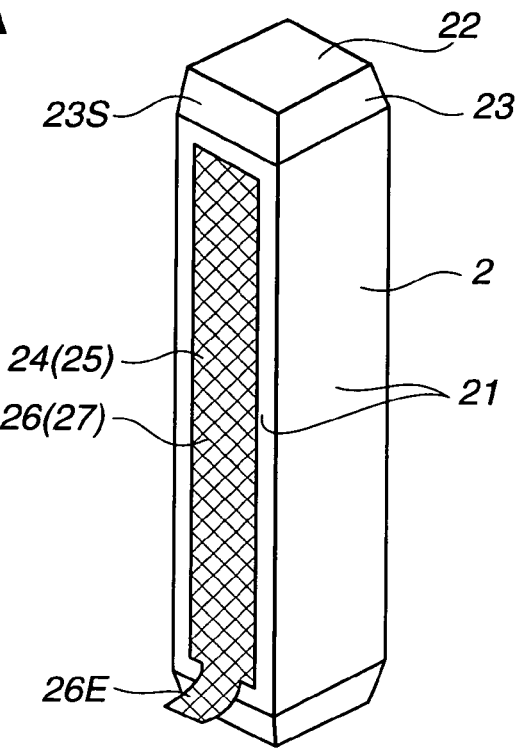
FIG. 3A is a perspective view of a piezoelectric layer unit according to the first embodiment of the present invention or a second embodiment of the present invention.
Figure 3B:
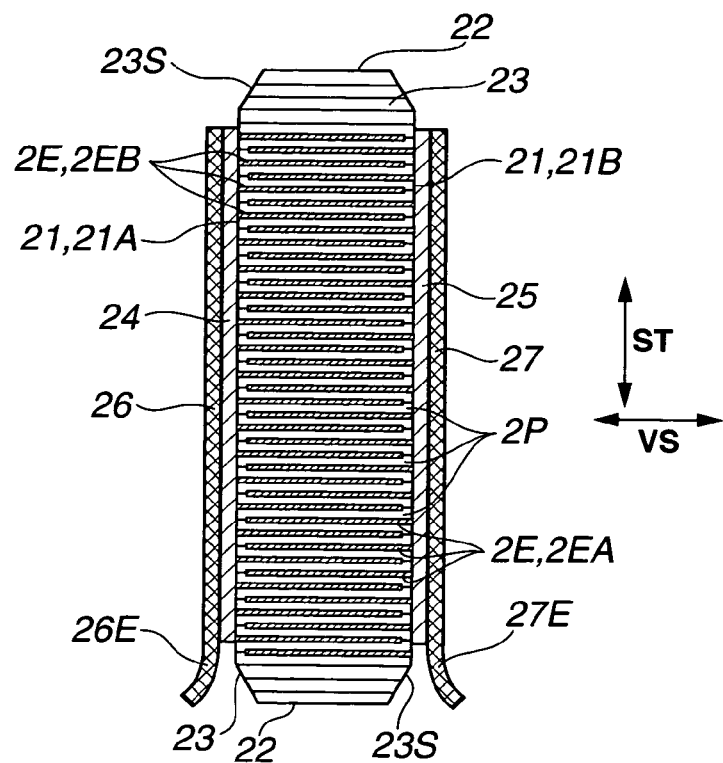
FIG. 3B is a sectional view of the piezoelectric layer unit of FIG. 3A.

Referring to FIGS. 1, 3A and 3B, a multilayer piezoelectric element 1 of the first embodiment includes at least one piezoelectric layer unit 2, by way of example, three piezoelectric layer units 2 (2A, 2B, 2C) having sintered piezoelectric ceramic layers 2P and electrode layers 2E stacked alternately together in a direction ST, a cylindrical casing member (protection case) 9 that encloses therewith a periphery of the piezoelectric layer unit assembly 6 along a direction VS perpendicular to the direction ST and a positioning member that controls the position of the piezoelectric layer unit assembly 6 within the casing member 9 along the direction VS. The piezoelectric layer units 2 (2A, 2B, 2C) may be combined into a unit assemble 6. Hereinafter, the direction ST in which the piezoelectric ceramic layers 2P and the electrode layers 2E are stacked together (i.e. the piezoelectric layer units 2 are stacked together) is referred to as the "layer stacking direction", and the direction VS (perpendicular to the layer stacking direction ST) in which the planes of the piezoelectric ceramic layers 2P and the electrode layers 2E extend is referred to the "layer plane direction".

It is likely that the piezoelectric layer unit 2 itself or the piezoelectric layer unit assembly 6 will become curved to make changes in distance to the casing member 9 and, in some cases, become buckled due to excessive curving as the dimension of the piezoelectric layer unit 2 or the piezoelectric layer unit assembly 6 along the layer stacking direction ST increases. The curving and buckling of the piezoelectric layer unit 2 or the piezoelectric layer unit assembly 6 is in particular likely to occur when the axis 2X of the piezoelectric layer unit 2 or the axis 6X of the piezoelectric layer unit assembly 6X is misaligned with the axis AX of the casing member 9. In the first embodiment, however, the position of the piezoelectric layer unit assembly 6 within the casing member 9 along the layer plane direction VS, i.e., each of the positions of the piezoelectric layer unit 2 within the casing member 9 along the layer plane direction VS is properly controlled by the positioning member. It is therefore possible to prevent curving and buckling of the piezoelectric layer unit 2 itself and the piezoelectric layer unit assembly 6 by contact of the positioning member with the casing member 9, even when an external force is applied in the layer stacking direction ST, and to provide the piezoelectric element 1 with high reliability and durability.

The positioning member may be kept in contact with or pressed against the piezoelectric layer unit 2 or the piezoelectric layer unit assembly 6 at all times, or be brought into contact with or pressed against the piezoelectric layer unit 2 or the piezoelectric layer unit assembly 6 at the time when the piezoelectric layer unit 2 or the piezoelectric layer unit assembly 6 gets curved. The positioning member may also be kept in contact with or pressed against the casing member 9 at all times or be brought into contact with or pressed against the casing member 9 at the time when the piezoelectric layer unit 2 or the piezoelectric layer unit assembly 6 gets curved. For example, the positioning member can be held in contact with or very close to an inner cylindrical surface 9S of the casing member 9 and an outer peripheral surface of the piezoelectric layer unit 2 or the piezoelectric layer unit assembly 6 so as to hold the piezoelectric layer unit 2 or the piezoelectric layer unit assembly 6 in position within the casing member 9.

In order to place the piezoelectric layer unit 2 or the piezoelectric layer unit assembly 6 in correct position to experience an external force, the positioning member is preferably designed to align the center 2X of the piezoelectric layer unit 2 along the layer plane direction VS or the center 6X of the piezoelectric layer unit assembly 6 along the layer plane direction VS substantially with the axis AX of the casing member 9. It becomes possible to prevent curving and buckling of the piezoelectric layer unit 2 or the piezoelectric layer unit assembly 6 more effectively by coaxial alignment of the piezoelectric the piezoelectric layer unit 2 or the piezoelectric layer unit assembly 6 with the casing member 9, and then, impart higher reliability and durability to the piezoelectric element 1.

Further, the positioning member is preferably retained by the piezoelectric layer unit 2 or the piezoelectric layer unit assembly 6 for easy and proper positioning of the piezoelectric layer unit 2 or the piezoelectric layer unit assembly 6 in the casing member 9.

In the case of the piezoelectric layer unit assembly 6, the interface portion between each two adjacent piezoelectric layer units 2 is most likely to become curved and buckled. In this case, it is desirable to arrange the positioning member around each interface portion between adjacent piezoelectric layer units 2. The positioning member can be also made lower in parts count when provided to the interface between each adjacent piezoelectric layer units 2 than when provided to the respective piezoelectric layer units 2. It becomes however possible to position the piezoelectric layer unit assembly 6 easily and properly and prevent the piezoelectric layer unit assembly 6 from curving and buckling effectively and assuredly, even though the positioning member has such a lower parts count, by arrangement of the positioning member around the interface portion between any adjacent piezoelectric layer units 2. When the positioning member is provided around the interface between each adjacent piezoelectric layer units 2, the positioning member is preferably designed to align opposing ends of the adjacent piezoelectric layer units 2 substantially with each other. This allows proper force transmission between these adjacent piezoelectric layer units 2, imparts high stiffness to the piezoelectric element 1 and reduces output loss of the piezoelectric element 1.

In the first embodiment, two spacers 5 (5A, 5B) are provided as the positioning member around the interface portions between adjacent ones of the piezoelectric layer units 2 (2A, 2B, 2C) as shown in FIG. 1. These spacers 5 are attached to the piezoelectric layer unit assembly 6 to form a spacer-attached piezoelectric layer unit assembly 6S such that the spacers 5 are retained by the piezoelectric layer units 2.

Referring again to FIG. 1, the multilayer piezoelectric element 1 further includes a pair of caps 10 and 11, a stepped push rod 13, a plurality of conical springs 12 (as an elastic member), two pairs of first and second electrode rods 42 (42A, 42B) and 45 (45A, 45B) and flexible lead wires 17 to 20, 43 and 46.

The cap 10 is welded in one end of the casing member 9, whereas the cap 11 is welded in the other end of the casing member 9 and held in contact with one end 6T2 of the piezoelectric layer unit assembly 6.

The push rod 13 is arranged between the cap 10 and the other end 6T1 of the piezoelectric layer unit assembly 6 and has a large-diameter rod portion 14 held in contact with the end 6T1 of the piezoelectric layer unit assembly 6 and a small-diameter rod portion 15 aligned coaxially with the large-diameter rod portion 14 and partially protruded through a rod insertion hole 10H of the cap 10.

The conical springs 12 are stacked together around the rod portion 15 so as to bias the rod portion 14 apart from the cap 10 and thereby exert a compressive stress onto the piezoelectric layer units 2 (the piezoelectric layer unit assembly 6) in the layer stacking direction ST.

The pair of the electrode rods 42A and 45A and the pair of the electrode rods 42B and 45B are retained by the spacers 5A and 5B, respectively. In the first embodiment, the electrode rods 42A, 42B, 45A and 45B are formed of copper (Cu) and plated with tin (Sn). The first electrode rods 42A, 42B and the second electrode rods 45A, 45B are connected to opposite sides of the piezoelectric layer units 2 via the electrode lead 43 and 46, respectively, for parallel electrical connection of the piezoelectric layer units 2. The first electrode rods 42A and 42B are connected to each other via the electrode lead 19, and the second electrode rods 45A and 45B are connected to each other via the electrode lead 20. Further, the electrode rods 42B and 45B are connected with the external leads 17 and 18, respectively.

As shown in FIGS. 3A and 3B, the piezoelectric ceramic layers 2P and the electrode layers 2E are stacked alternately in the layer stacking direction ST as already mentioned above, so that each of the piezoelectric layer units 2 is formed into a substantially rectangular parallelepiped shape with a pair of end surfaces 22 (22A1, 22A2, 22B1, 22B2, 22C1, 22C2) and four side surfaces 21 including a pair of opposite side surfaces 21A and 21B.

The piezoelectric ceramic layers 2P can be formed of any piezoelectric ceramic composite material such as a known piezoelectric ceramic composite of e.g. lead zirconate titanate or barium titanate or a piezoelectric ceramic composite predominantly composed of alkali niobate. In the first embodiment, the piezoelectric ceramic layers 2P are formed of an alkali niobate ceramic material.

The electrode layers 2E can be formed of any electrically conductive material such as silver (Ag), palladium (Pd), platinum (Pt), Ag—Pd alloy, Ag—Pt alloy, copper (Cu) or nickel (Ni). In the first embodiment, the electrode layers 2E are formed of platinum. Herein, the electrode layers 2E includes alternating first and second electrode layers 2EA and 2EB (as inner electrodes) as shown in FIG. 3B. The first electrode layers 2EA are set back from the side surface 21A and exposed to the side surface 21B, whereas the second electrode layers 2EB are set back from the side surface 21B and exposed to the side surface 21A.

The piezoelectric layer units 2 also have first and second straight electrodes 24 and 25 (as outer electrodes) and first and second mesh conductors 26 and 27. The first and second straight electrodes 24 and 25 are arranged on the side surfaces 21A and 211B and connected to the electrode layers 2EB and 2EA, respectively. Although the straight electrodes 24 and 25 can be formed of any electrically conductive material, the straight electrodes 24 and 25 are formed substantially of silver (Ag) in the first embodiment. The first and second mesh conductors 26 and 27 are soldered to the first and second straight electrodes 24 and 25, respectively, and formed of copper (Cu) in the first embodiment. As shown in FIGS. 3A, 3B, 5A and 9B, flexible terminal portions 26E are formed on either one or both ends of the first mesh conductors 26, without being fixed to the first straight electrodes 24, for connection with the electrode leads 43. Flexible terminal portions 27E are also formed on either one or both ends of the second mesh conductors 27 without being fixed to the second straight electrode 25, as shown in FIGS. 3B and 9B, for connection with the electrode leads 46. There are thus established electrical connection paths 41 between the straight electrodes 24 of any adjacent piezoelectric layer units 2 via the conductors 26, the electrode rods 42 and the leads 43 and electrical connection paths 44 between the straight electrodes 25 of any adjacent piezoelectric layer units 2 via the conductors 27, the electrode rods 45 and the leads 46 as shown in FIGS. 1 and 9B.

In the piezoelectric layer units 2, the piezoelectric ceramic layers 2P are polarized in the direction from the first electrode layers 2EA toward the second electrode layers 2EB such that each of the piezoelectric ceramic layers 2P becomes deformed to expand in a thickness direction thereof (i.e. increase in thickness) when the first electrode layers 2EA have positive potentials relative to the second electrode layers 2EB. In other words, all of the piezoelectric layer units 2 expand in the layer stacking direction ST when the first straight electrodes 24 are charged to positive potentials relative to the second straight electrodes 25 through the electrical connection paths 41 and 44 and the lead wires 19 and 20 by the application of a voltage between the external leads 17 and 18. The expansions of the piezoelectric layer units 2 are summed and outputted as a displacement of the rod portion 15 of the push rod 13.

Further, two opposite ends 23 (23A1, 23A2, 23B1, 23B2, 23C1, 23C2) of the piezoelectric layer units 2 (2A, 2B, 2C) are chamfered and formed into substantially quadrangular pyramid frustum shapes with pyramidal surfaces 23S (23SA1, 23SA2, 23SB1, 23SB2, 23SC1, 23SC2) as shown in FIGS. 3A, 3B, 5A, 5B and 6. It should be noted that no electrodes are formed on the ends 23 of the piezoelectric layer units 2 so as not to cause deformation in the ends 23 of the piezoelectric layer units 2 even through the application of a potential difference between the electrodes 24 and 25.

Figure 4A:
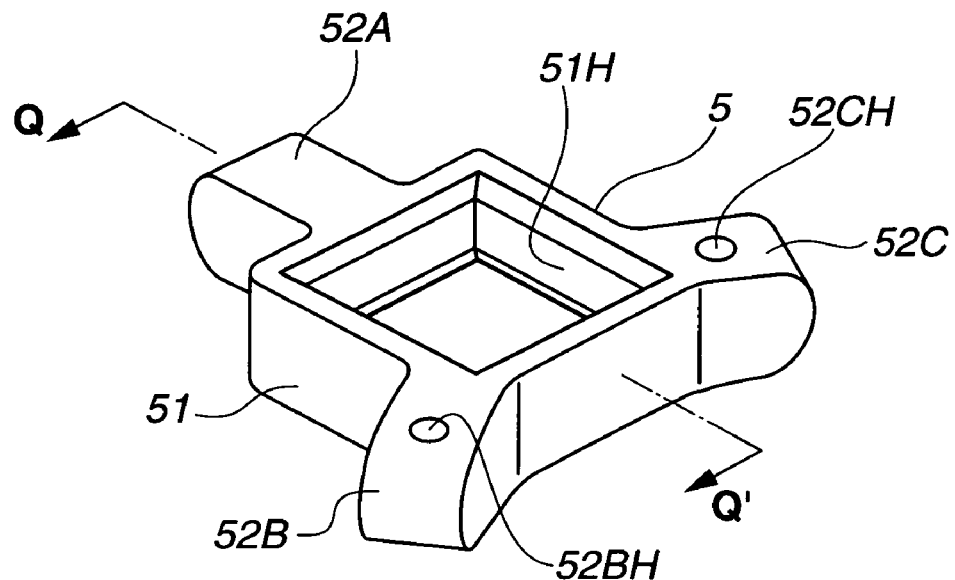
FIG. 4A is a perspective view of a spacer according to the first and second embodiments of the present invention.
Figure 4B:
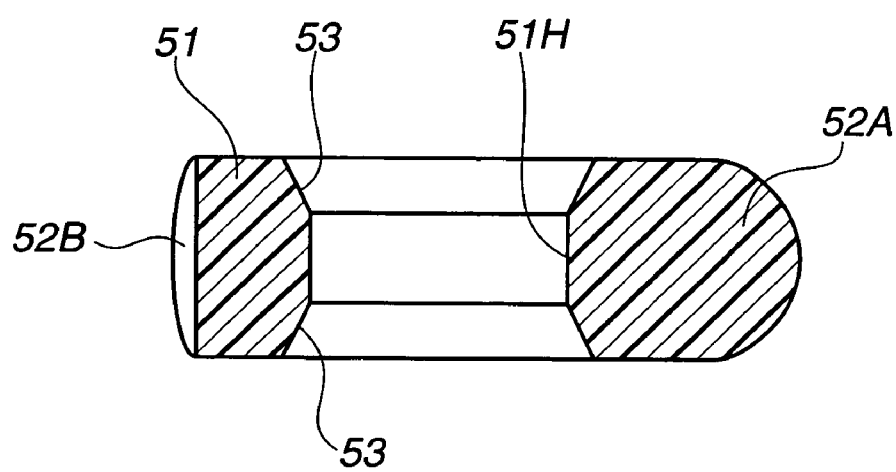
FIG. 4B is a sectional view of the spacer taken along a line Q-Q' of FIG. 4A.

The spacers 5 are made of an insulating resinous material such as polyethyl ether ketone (PEEK) or polyamide (PA). As shown in FIGS. 4A and 4B, each of the spacers 5 has a square frame portion 51 and three protruding contact portions 52A, 52B and 52C. The spacer frame portion 51 has a substantially square center hole 51H formed with inclined surfaces 53 in such a manner that the hole 51H increases in size toward its opening ends. The contact portions 52A, 52B and 52C protrude radially outwardly from the spacer frame portion 51 at positions about 120 degrees apart from one another.

Figure 5A:
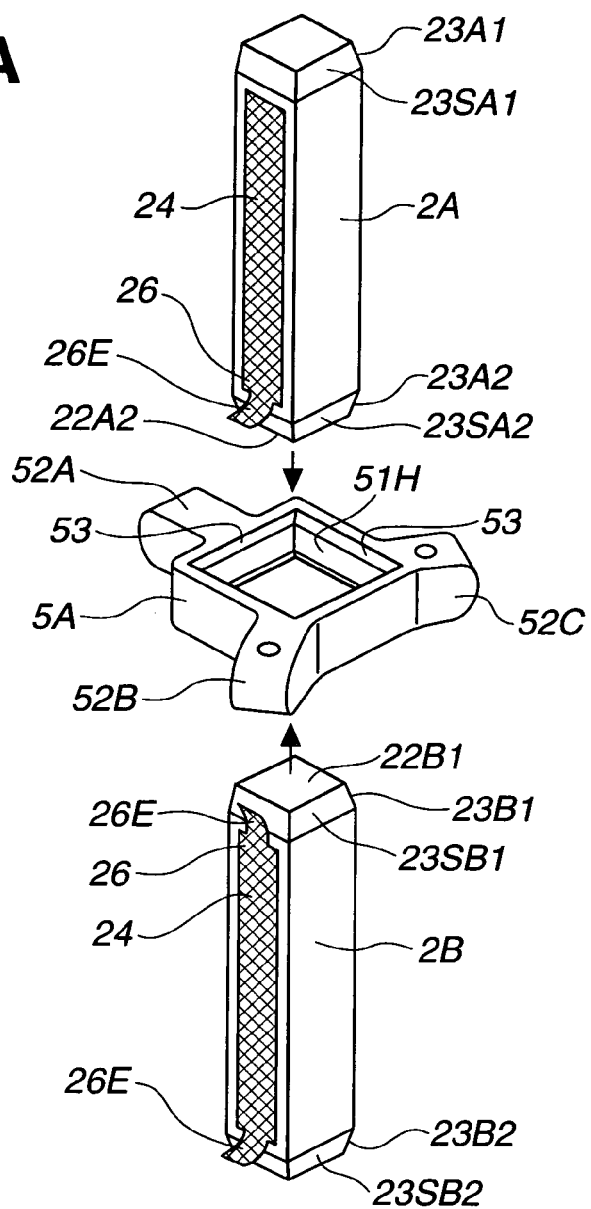
FIG. 5A is an exploded perspective view showing how to assemble the piezoelectric layer units and spacer according to the first and second embodiments of the present invention.
Figure 5B:
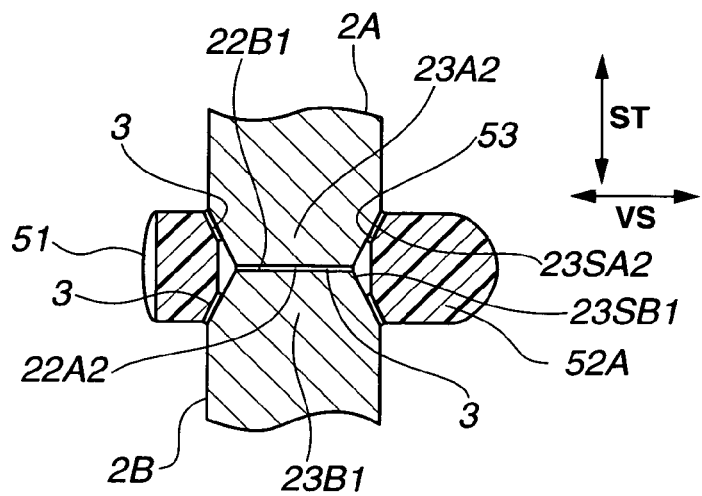
FIG. 5B is a sectional view showing a joint between two adjacent piezoelectric layer units according to the first and second embodiments of the present invention.

The opposing ends 23 of two adjacent piezoelectric layer units 2 are fitted in the center hole 51H of the spacer 5 so as to surround the interface between these two adjacent piezoelectric layer units 2 by the spacer frame portion 51 as is apparent from FIGS. 1, 5A and 5B. For example, the interface between the piezoelectric layer units 2A and 2B is surrounded by the frame portion 51 of the spacer 5A, with the end surface 22A2 of the piezoelectric layer unit 2A and the end surface 22B1 of the piezoelectric layer unit 2B abutting each other and the pyramidal surfaces 23SA2, 23SB1 of the piezoelectric layer units 2A, 2B abutting the respective inclined surfaces 53 of the spacer 5A, when the end 23A2 of the piezoelectric layer unit 2A and the end 23B1 of the piezoelectric layer unit 2B are properly fitted in the hole 5H of the spacer 5A. In the first embodiment, the opposed end surfaces 22 of two adjacent piezoelectric layer units 2 are bonded to each other by an adhesive 3. The pyramidal surfaces 23S of the piezoelectric layer units 2 are also bonded to the inclined surfaces 53 of the spacer frame portion 51 by an adhesive 3 in the first embodiment.

Figure 2:
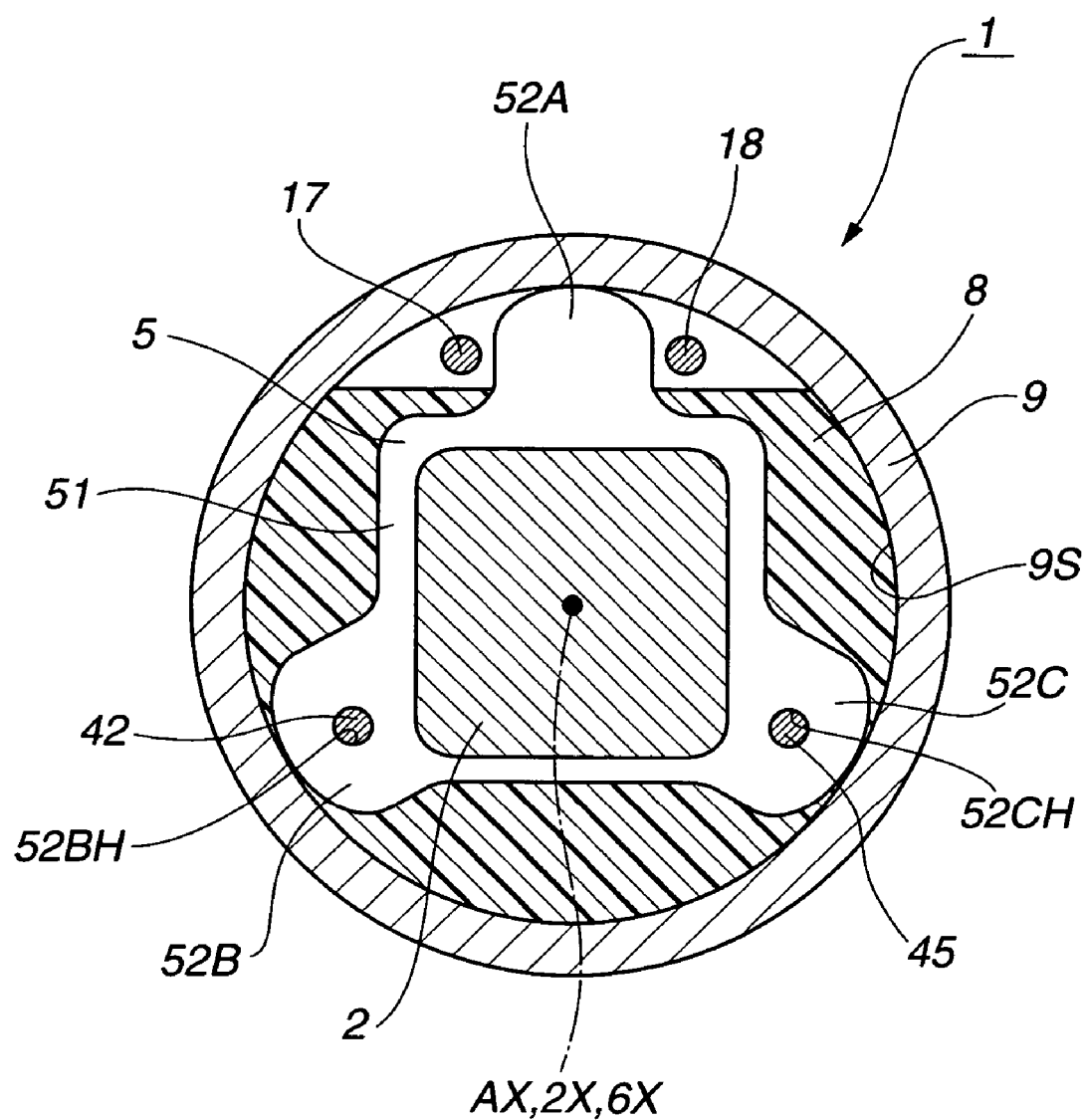
FIG. 2 is a cross sectional view of the multilayer piezoelectric element taken along a line P-P' of FIG. 1.

As shown in FIG. 2, the inner cylindrical surface 9S of the casing member 9 is substantially equal in diameter to a circle circumscribing the contact portions 52A, 52B and 52C of the spacer 5. Upon placement of the spacer-attached piezoelectric layer unit assembly 6S in the casing member 9, the spacer contact portions 52A, 52B and 52C come into contact with or very close to the inner cylindrical surface 9S of the casing member 9 to control the positions of the piezoelectric layer units 2 within the casing member 9 in such a manner that each of the centers 2X of the piezoelectric layer units 2 along the layer plane direction VS (the center 6X of the piezoelectric layer unit assembly 6 along the layer plane direction VS) is substantially in alignment with the axis AX of the casing member 9.

The multilayer piezoelectric element 1 further includes a resin mold member 8 enclosing a periphery of the spacer-attached piezoelectric layer unit assembly 6S with the spacer contact portions 52A, 52B and 52C exposing through an outer surface of the resin member 8, as shown in FIGS. 1 and 2, so as to protect the piezoelectric layer units 2 from moisture, oil and external force and to achieve easy handling of the piezoelectric layer unit assembly 6 in the first embodiment. The spacer-attached piezoelectric layer unit assembly 6S with the resin mold member 8 is hereinafter referred to as a resin-molded piezoelectric layer unit assembly 7. (This resin-molded piezoelectric layer unit assembly 7 can be used solely as a multilayer piezoelectric element as will be explained later.)

The above-structured multilayer piezoelectric element 1 is produced by the following procedure in the first embodiment.

Figure 6:
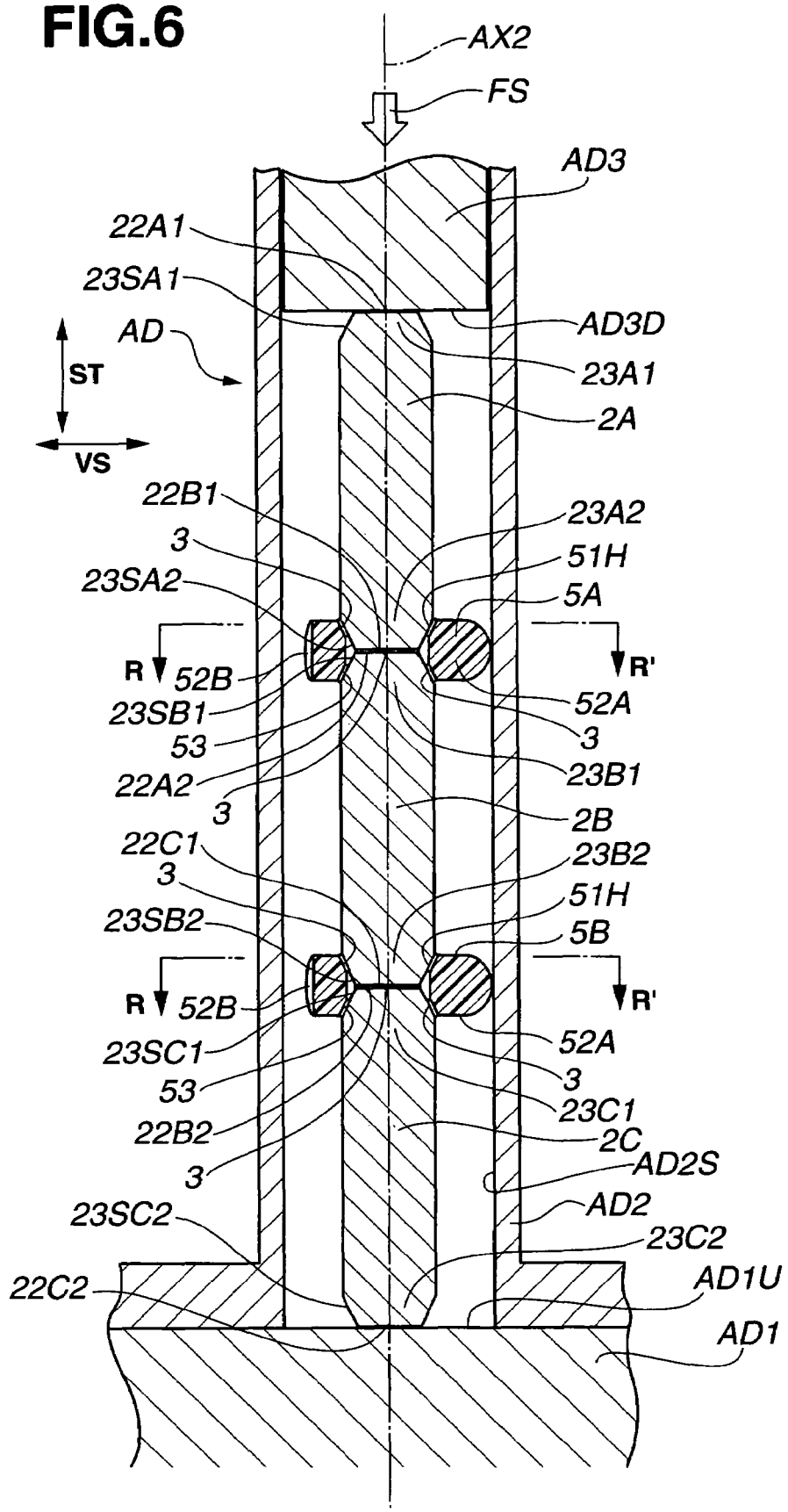
FIG. 6 is a schematic view showing how to join the piezoelectric layer units and spacers using an assembling jig according to the first and second embodiments of the present invention.
Figure 7:
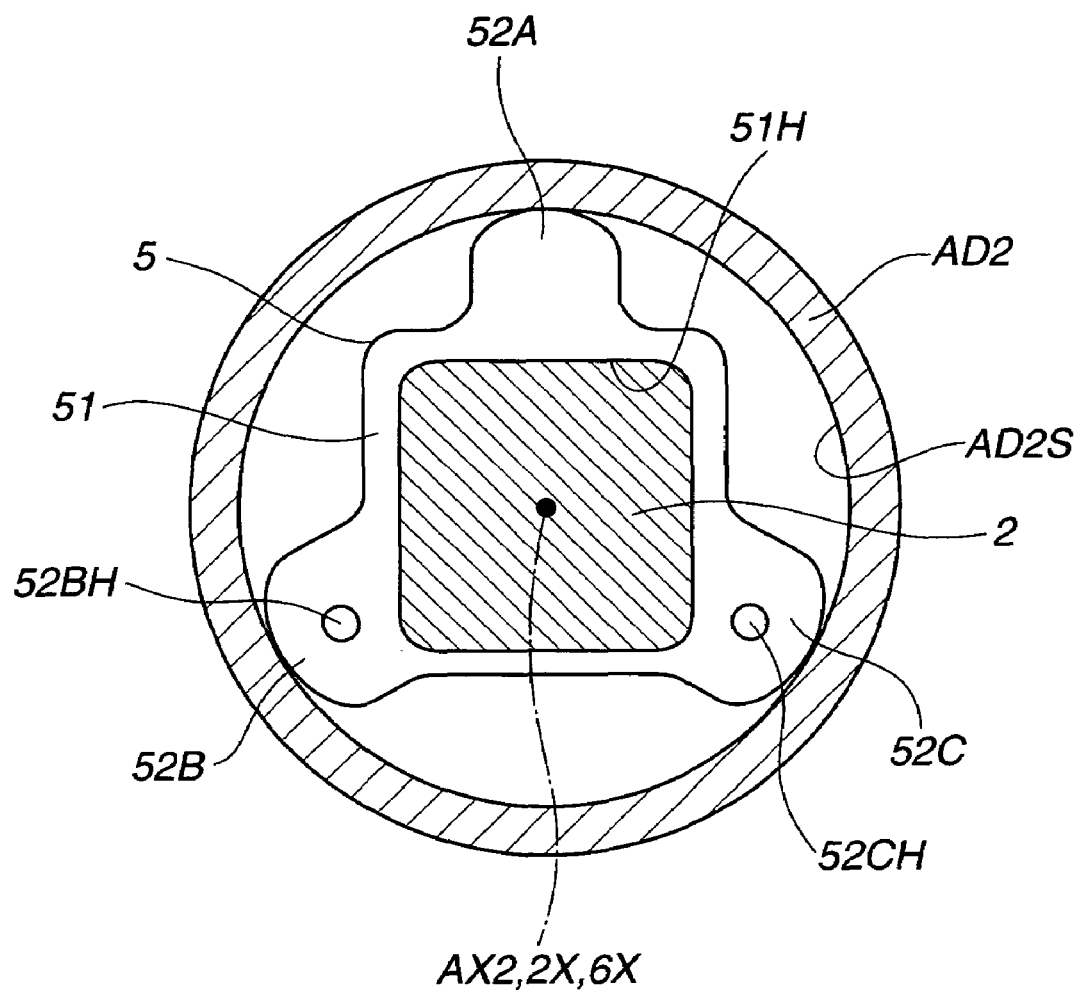
FIG. 7 is a sectional view of the piezoelectric layer unit assembly and the assembling jig taken along a line R-R' of FIG. 6.

First, the piezoelectric layer units 2A, 2B, 2C and the spacers 5A, 5B are joined into one using an assembling jig AD as shown in FIGS. 6 and 7. The assembling jig AD includes a base member AD1 formed with a flat base surface AD1U, a substantially cylindrical jig member AD2 formed with an inner cylindrical surface AD2S and a substantially cylindrical column member AD3 formed with a flat column end surface AD3D and shaped to fit in the cylindrical jig member AD2. The spacer-attached piezoelectric layer unit assembly 6S is thus provided by inserting the piezoelectric layer unit 2C, the spacer 5B, the piezoelectric layer unit 2B, the spacer 5A and the piezoelectric layer unit 2A into the cylindrical jig member AD2 in order of mention, and then, putting the piezoelectric layer units 2A, 2B, 2C and the spacers 5A, 5B together through the application of a pressure FS by the column member AD3.

More specifically, the piezoelectric layer unit 2C is first inserted in the cylindrical jig member AD2 so that the end surface 22C2 of the piezoelectric layer unit 2C abuts the base surface AD1U of the base member AD1.

The spacer 5B is next inserted in the cylindrical jig member AD2. In the meanwhile, the position of the piezoelectric layer unit 2C along the layer plane direction VS is adjusted so as to engage the end 23C1 of the piezoelectric layer unit 2C in the unit insertion hole 51H of the spacer 5B.

As shown in FIG. 7, the assembling jig AD has the same inner surface profile as that of the casing member 9 so that the inner cylindrical surface AD2S of the cylindrical member AD2 is substantially equal in diameter to a circle circumscribing the contact portions 52A, 52B and 52C of the spacers 5. The spacer contact portions 52A, 52B and 52C come into contact with or very close to the inner cylindrical surface AD2S of the cylindrical jig member AD2 to roughly determine the positions of the spacers 5 along the layer plane direction VS upon insertion of the spacers 5 into the cylindrical jig member AD2.

The piezoelectric layer unit 2C is thus properly positioned in such a manner that the center 2X of the piezoelectric layer unit 2C along the layer plane direction VS, notably the center position of the end 23C1 of the piezoelectric layer unit 2C along the layer plane direction VS, is substantially in alignment with the axis AX2 of the cylindrical jig member AD2 when the end 23C1 of the piezoelectric layer unit 2C is engaged in the unit insertion hole 51H of the spacer 5B. The adhesive 3 has been applied to the end 23C1 (the end surface 22C1 and the pyramidal surfaces 23SC1) of the piezoelectric layer unit 2C before the insertion of the piezoelectric layer unit 2C into the cylindrical jig member AD2. The pyramidal surfaces 23SC1 of the piezoelectric layer unit 2C abut the inclined surface 53 of the spacer 5B through the adhesive 3 upon fitting of the end 23C1 of the piezoelectric layer unit 2C into the unit insertion hole 51H of the spacer 5B.

Subsequently, the piezoelectric layer unit 5B is inserted in the cylindrical jig member AD2 so as to engage the end 23B2 of the piezoelectric layer unit 5B in the unit insertion hole 51H of the spacer 5B. The adhesive 3 has also been applied to the end 23B2 of the piezoelectric layer unit 2B before the insertion of the piezoelectric layer unit 2B into the cylindrical jig member AD2. Upon fitting of the end 23B2 of the piezoelectric layer unit 2B into the unit insertion hole 51H of the spacer 5B, the end surface 22B2 and the pyramidal surfaces 23SB2 of the piezoelectric layer unit 2B abut the end surface 22C1 of the piezoelectric layer unit 2C and the inclined surface 53 of the spacer 5B, respectively, through the adhesive 3. Further, the end 23B2 of the piezoelectric layer unit 2B is properly positioned in such a manner that the center position of the end 23B2 of the piezoelectric layer unit 2B along the layer plane direction VS is substantially in alignment with the axis AX2 of the cylindrical jig member AD2 when the end 23B2 of the piezoelectric layer unit 2B is engaged in the unit insertion hole 51H of the spacer 5B. In the first embodiment, it is also possible to allow not only coaxial alignment of the end 23B2 of the piezoelectric layer unit 2B and the end 23C1 of the piezoelectric layer unit 2C but circumferential positioning of the piezoelectric layer units 2B and 2C by engagement of the quadrangular pyramidal ends 23B2 and 23C1 of the piezoelectric layer units 2B and 2C into the square hole 51H of the spacer 5B.

The spacer 5A is inserted in the cylindrical jig member AD2 so as to engage the end 23B1 of the piezoelectric layer unit 5B in the unit insertion hole 51H of the spacer 5A and align the center position of the end 23B1 of the piezoelectric layer unit 2B along the layer plane direction VS substantially with the axis AX2 of the cylindrical member AD2. The piezoelectric layer unit 2A is then inserted in the cylindrical jig member AD2 so as to engage the end 23A2 of the piezoelectric layer unit 5A in the unit insertion hole 51H of the spacer 5A and align the center position of the end 23A2 of the piezoelectric layer unit 2A along the layer plane direction VS substantially with the axis AX2 of the cylindrical member AD2. It is also possible to allow not only coaxial alignment of the end 23A2 of the piezoelectric layer unit 2A and the end 23B1 of the piezoelectric layer unit 2B but circumferential positioning of the piezoelectric layer units 2A and 2B by fitting the quadrangular pyramidal ends 23A2, 23B1 of the piezoelectric layer units 2A, 2B into the square hole 51H of the spacer 5A. The adhesive 3 has been applied to the ends 23A2 and 23B1 of the piezoelectric layer units 2A and 2B before the insertion of the piezoelectric layer units 2A and 2B into the cylindrical member AD2. Thus, the pyramidal surfaces 23SA2 and 23SB1 of the piezoelectric layer units 2A and 2B abut the inclined surfaces 53 of the spacer 5A through the adhesive 3 and the end surface 22A2 of the piezoelectric layer unit 2A and the end surface 22B1 of the piezoelectric layer unit 2B abut each other through the adhesive 3 upon fitting of the ends 23A2 and 23B1 of the piezoelectric layer units 2A, 2B into the hole 51H of the spacer 5A.

The column member AD3 is inserted in the cylindrical jig member AD2 to press the end surface AD3D of the column member AD3 against the end surface 22A1 of the piezoelectric layer unit 2A and exert a force FS onto the piezoelectric layer units 2A, 2B and 2C along the direction of the axis AX2 of the cylindrical jig member AD2. In this state, heat is applied to cure the adhesive 3. The piezoelectric layer units 2A, 2B and 2C and the spacers 5A and 5B are then bonded together by the adhesive 3 to thereby complete the spacer-attached piezoelectric layer unit assembly 6S (the piezoelectric layer unit assembly 6).

As described above, the spacers 5A and 5B are used to hold the piezoelectric layer units 2A, 2B and 2C in position within the assembling jig AD. This allows easy and proper assembling (stacking and bonding) of the piezoelectric layer units 2A, 2B and 2C. Although the assembling jig AD has the same inner surface profile as that of the casing member 9 in the first embodiment, the assembling jig AD may alternatively have a different inner surface profile that allows the spacer contact portions 52A, 52B and 52C to control the positions of the piezoelectric layer units 2A, 2B and 2C within the assembling jig AD.

Next, electrical wiring is done as follows.

Figure 8:
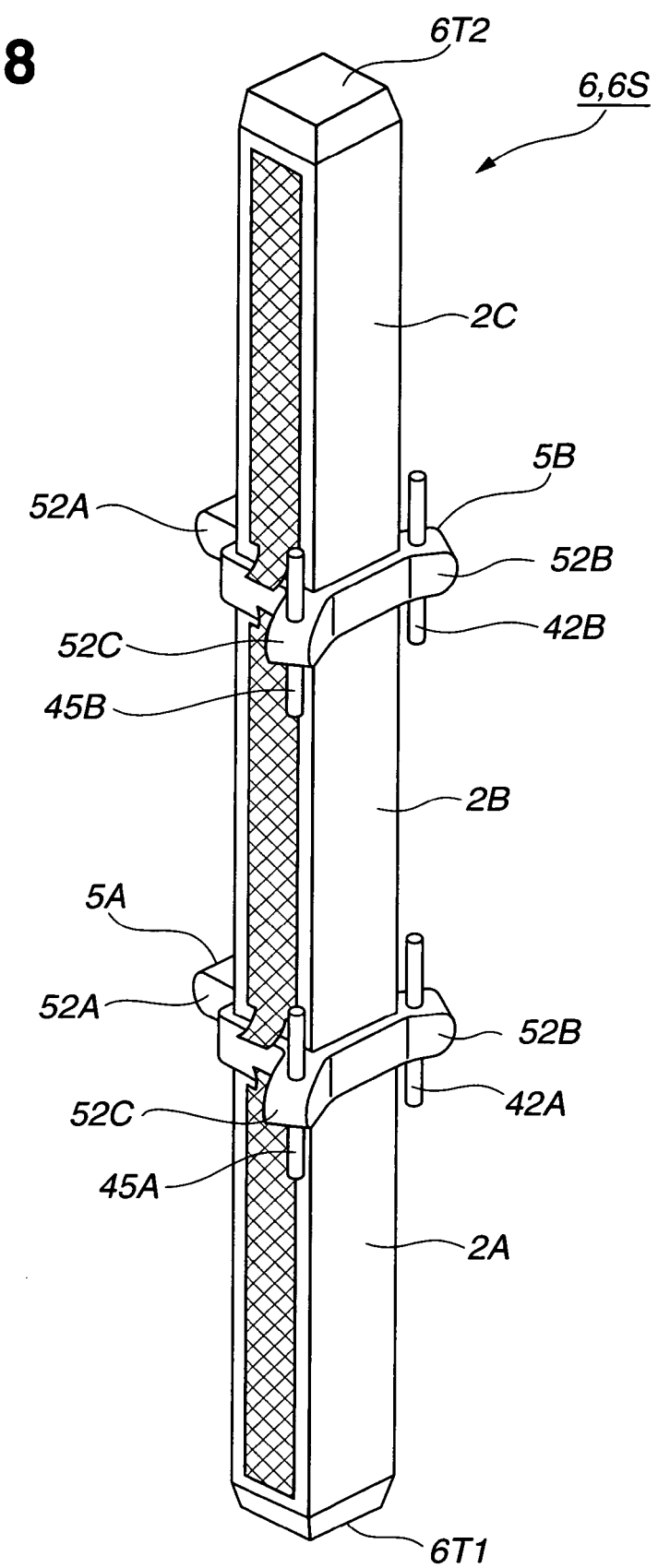
FIG. 8 is a perspective view of the piezoelectric layer unit assembly without an electrical wiring arrangement according to the first and second embodiments of the present invention.

The first electrode rods 42A, 42B and the second electrode rods 45A, 45B are retained in the rod insertion holes 52BH and 52CH of the spacers 5A and 5B, respectively, as shown in FIG. 8.

The external leads 17 and 18 are soldered to the electrode rods 42B and 45B, respectively, as shown in FIG. 9A.

The first electrode rods 42A and 42B are connected to each other by soldering the ends of the lead 19 to the electrode rods 42A and 42B, respectively, as shown in FIG. 9A. As shown in FIG. 9A, the second electrode rods 45A and 45B are also connected to each other by soldering the ends of the lead 20 to the electrode rods 45A and 45B, respectively.

The first straight electrodes 24 of the piezoelectric layer units 2A, 2B and 2C are then connected to the first electrode rods 42 by soldering the ends of the electrode leads 43 to the terminal portions 26E of the mesh conductors 26 and the terminal portions of the electrode rods 42, respectively, as shown in FIG. 9B. Similarly, the second straight electrodes 25 of the piezoelectric layer units 2A, 2B and 2C are connected to the second electrode rods 45 by soldering the ends of the electrode leads 46 to the terminal portions 27E of the mesh conductors 27 and the terminal portions of the electrode rods 45, respectively.

With such an arrangement, the positional relationship of the electrode rods 42A, 42B, 45A and 45B with the piezoelectric layer units 2A, 2B and 2C can be automatically and properly determined on the positions of the rod insertion holes 52BH and 52CH in the spacer contact portions 52B and 52C. As the first and second electrode rods 42 and 45 are retained by the contact portions 52B and 52C of the spacers 5A and 5B with some space left between the electrode rods 42A, 42B, 45A and 45B and the outer surfaces 21 of the piezoelectric layer units 2A, 2B and 2C, the electrical connection paths 41 and 44 can be kept separated from each other. This makes it possible to prevent short circuit between the electrical connection paths 41 and 44 and between the electrical connection path 41, 44 and the other structural component. The spacers 5A and 5B are disposed around the respective interface portions between the piezoelectric layer units 2A and 2B and between the piezoelectric layer units 2B and 2C with the spacers 5A and 5B. The electrode rods 42A and 42B stand midway between the outer electrodes 24 of the piezoelectric layer units 2A and 2B and between the outer electrodes 24 of the piezoelectric layer units 2B and 2C, respectively. Also, the electrode rods 45A and 45B stand midway between the outer electrodes 25 of the piezoelectric layer units 2A and 2B and between the outer electrodes 25 of the piezoelectric layer units 2B and 2C. The electrical connection paths 41 and 44 can be thus made short in length (i.e. compact in size) and low in resistance. Furthermore, the electrical connection paths 41 and 44 are capable of following the expansions and contractions of the piezoelectric layer units 2A, 2B and 2C because of flexibility of the electrode leads 43, 46 and the terminal portions 26E, 27E of the mesh conductors 26, 27 while maintaining electrical connections between the first straight electrodes 24 and between the second straight electrodes 25. This makes it possible to prevent breakings of the electrical connection paths 41 and 44 during the expansion and contractions of the piezoelectric layer units 2A, 2B and 2C.

Figure 10:
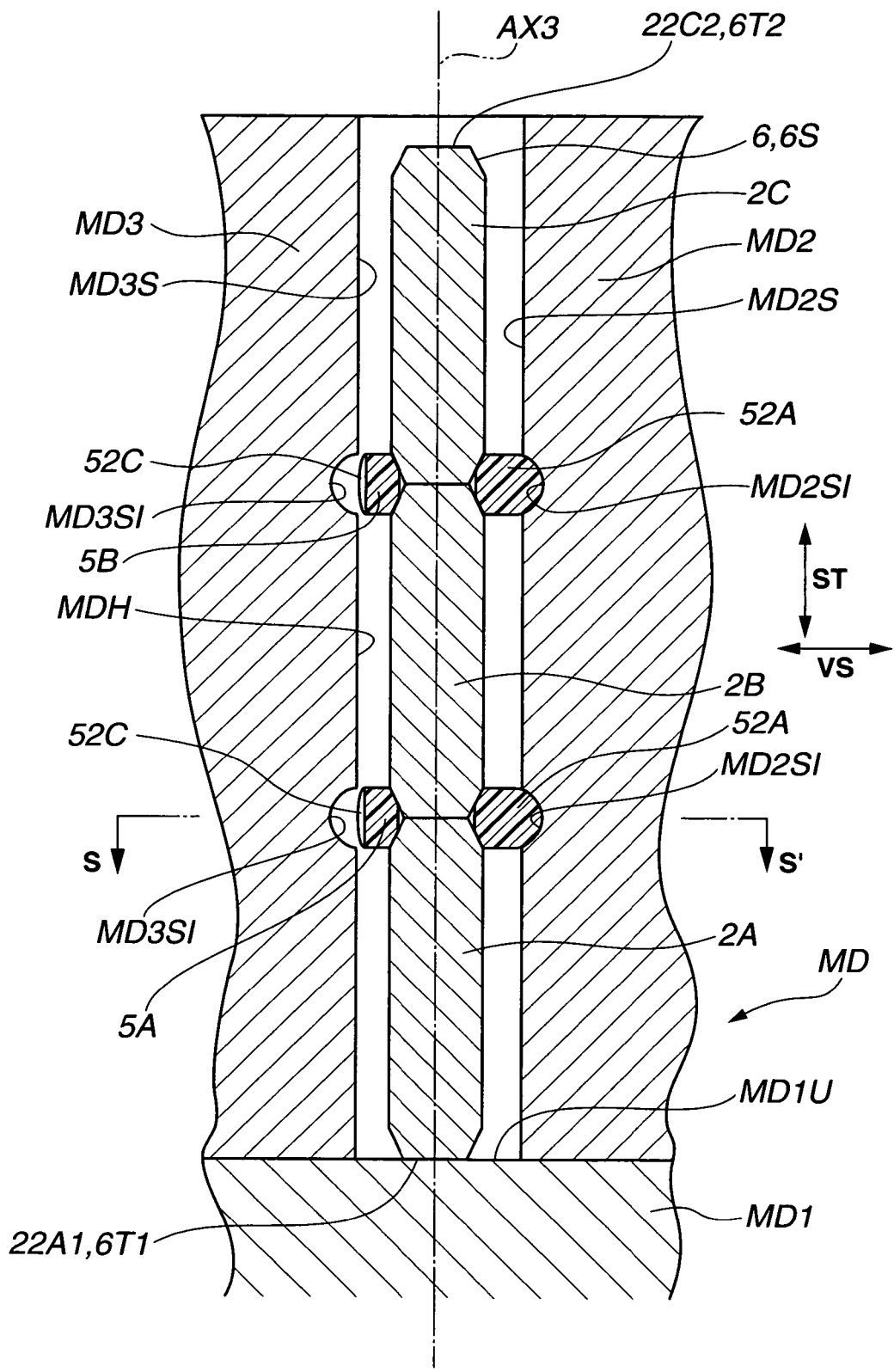
FIG. 10 is a schematic view showing how to mold the piezoelectric layer unit assembly into a resin using a molding jig according to the first and second embodiments of the present invention.
Figure 11:
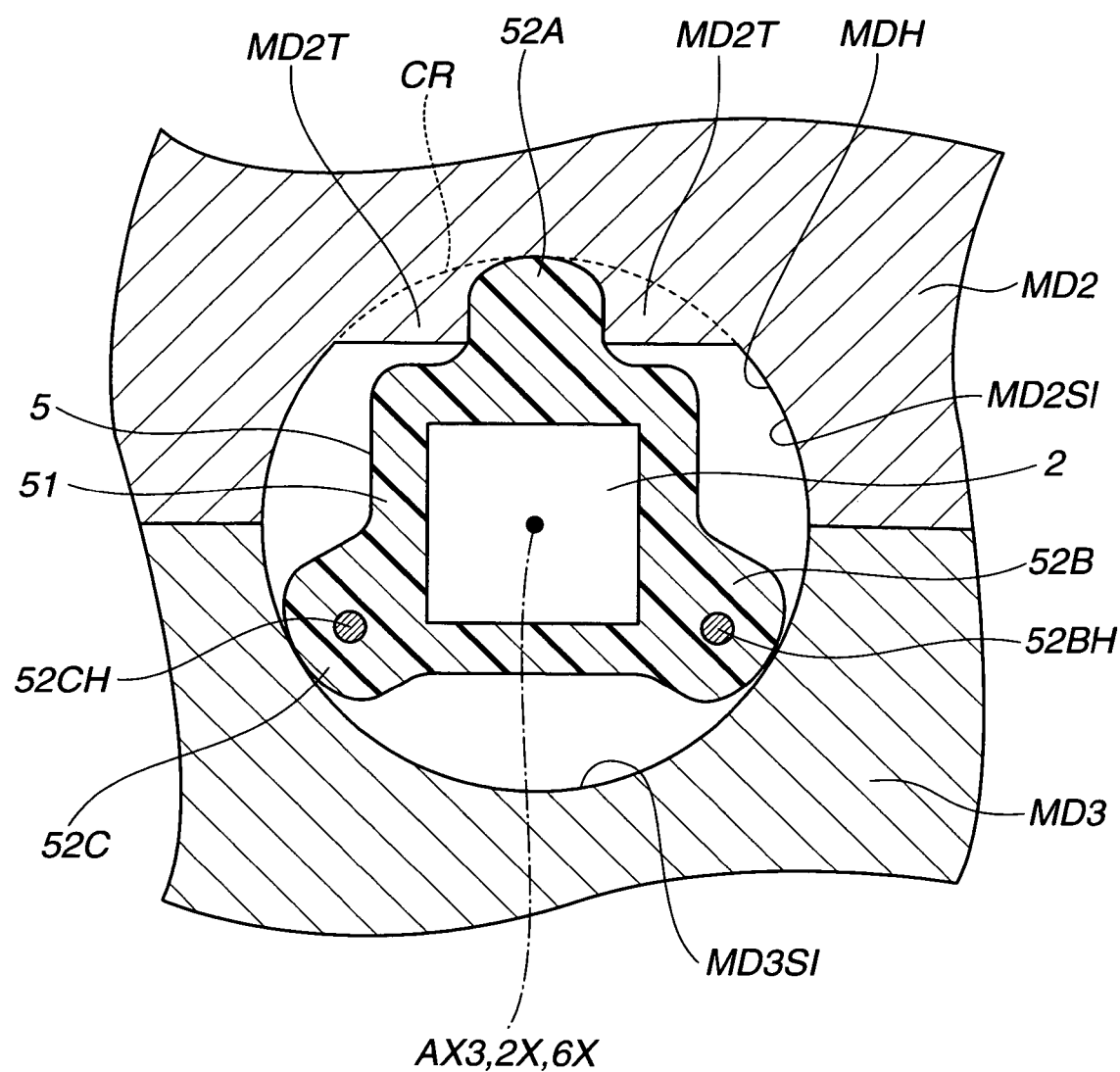
FIG. 11 of a sectional view of the piezoelectric layer unit assembly and the molding jig taken along a line S-S' of FIG. 10.

After that, the resin mold member 8 is formed around the spacer-attached piezoelectric layer unit assembly 6S using a molding jig MD as shown in FIGS. 10 and 11. The molding jig MD includes a base member MD1 with a flat base surface MD1U and a pair of first and second semi-cylindrical members MD2 and MD3 arranged on the base surface MD1U of the base member MD1 and opposed to each other so as to define a substantially oval retaining hole MDH between their respective inner cylindrical surfaces MD2S and MD3S. (The first and second semi-cylindrical members MD2 and MD3 can be provided by cutting a structural component with a substantially oval hole into two pieces along directions of the axis and longer diameter of the hole.) Two positioning recesses MD2SI are formed in the inner cylindrical surface MD2S of the first cylindrical member MD2 radially outwardly of the retaining hole MDH. Two positioning recesses MD3SI are also formed in the inner cylindrical surface MD3S of the second cylindrical member MD3 radially outwardly of the retaining hole MDH. The positioning recesses MD2SI and MD3SI are located at positions axially corresponding to each other so as to define two annular grooves by the positioning recesses MD2SI and MD3SI. The maximum outer diameters of the annular grooves are herein made approximately equal to the diameter of a circle CR circumscribing the contact portions 52A, 52B and 52C of the spacers 5A and 5B as shown in FIG. 11. Further, molding prevention protrusions MD2T are provided on the first cylindrical member MD2 so as to extend into the positioning recesses MD2SI on both sides of the spacer contact portions 52A. In the presence of these protrusions MD2T, the resin mold member 8 can be readily formed into a substantially oval column profile with a side surface 8TS such that the external leads 17 and 18 are laid on a side surface 8TS of the resin mold member 8 at both side of the spacer contact portions 52A.

The resin molding is more specifically performed as follows.

The piezoelectric layer unit assembly 6S is first placed on the base member MD1 such that the end surface 6T1 of the piezoelectric layer unit assembly 6 (the end surface 22A1 of the piezoelectric layer unit 2A) abuts the base surface MD1U of the base member MD1. Next, the first and second semi-cylindrical members MD2 and MD3 are arranged to sandwich the piezoelectric layer unit assembly 6S between the inner surfaces MD2S, MD3S of the semi-cylindrical members MD2, MD3 and thereby accommodate the piezoelectric layer unit assembly 6S in the retaining hole MDH of the molding jig MD. At this time, the contact portions 52A, 52B and 52C of the spacers 5A, 5B are engaged in the positioning recesses MD2SI and MD3SI of the molding jig MD and brought into contact with or very close to the walls of the positioning recesses MD2SI and MD3SI. The positions of the spacers 5A are 5B along the layer plane direction VS are thus determined in such a manner that the center 6X of the piezoelectric layer unit assembly 6 along the layer plane direction VS (i.e. each of the centers 2X of the piezoelectric layer units 2A, 2B and 2C along the layer plane direction VS) is substantially in alignment with the axis AX3 of the retaining hole MDH of the molding jig MD. The external leads 17 and 18 are drawn out of the retaining hole MDH although not so shown in FIG. 10.

The resin mold member 8 is then prepared by filling an insulating resin material (such as a silicon resin or an epoxy resin) into a space between the outer surface of the piezoelectric layer unit assembly 6S and the inner cylindrical surfaces MD2S and MD3S of the jig members MD2 and MD3 within the retaining hole MDH of the molding jig MD, and then, curing the insulating resin material. It is noted that the insulating resin material is the one capable of showing elasticity when cured. Although the piezoelectric layer unit assembly 6S is directly molded in the resin mold member 8 in the first embodiment, the piezoelectric layer unit assembly 6S may alternatively be covered with an insulating coating before molded in the resin member 8.

As described above, the spacers 5A and 5B are also used to hold the piezoelectric layer units 2A, 2B and 2C in position within the molding jig MD. This allows easy and proper placement (molding) of the piezoelectric layer units 2A, 2B and 2C in the resin mold member 8. Although the molding jig MD has the same inner surface profile as that of the casing member 9 in the first embodiment, the molding jig MD may alternatively have a different inner surface profile that allows the spacer contact portions 52A, 52B and 52C to control the positions of the piezoelectric layer units 2A, 2B and 2C within the molding jig MD. The inner surface profile of the molding jig MD may be made smaller than that of the casing member 9 for ease of the resin-molded piezoelectric layer assembly 7 into the casing member 9.

The thus-obtained resin-molded piezoelectric layer unit assembly 7 is substantially oval in cross section as is apparent from FIGS. 12A and 12B. The contact portions 52A, 52B and 52C of the spacers 5A and 5B are exposed through the resin mold member 8, as shown in FIGS. 12A and 12B, so as to control the positions of the piezoelectric layer units 2A, 2B and 2C without being interfered with by the resin mold member 8. The spacer contact portions 52A protrude from the side surface 8TS of the resin mold member 8, and the external leads 17 and 18 are bent and laid along the side surface 8TS of the resin mold member 8 on both sides of the contact portions 52A of the spacers 5A and 5B.

Finally, the resin-molded piezoelectric layer unit assembly 7 and the other structural components 9 to 13 are assembled. After welding the cap 11 to the casing member 9, the resin-molded piezoelectric layer unit assembly 7 is inserted in the casing member 9 such that the end surface 6T2 of the piezoelectric layer unit assembly 6 (the end surface 22C2 of the piezoelectric layer unit 2C) abut the cap 11. As the piezoelectric layer units 2A, 2B, 2C and the spacers 5A, 5B have been assembled into the unit assembly 6S, the piezoelectric layer units 2A, 2B, 2C and the spacers 5A, 5B can be easily and properly positioned in the casing member 9 by means of the spacer contact portions 52A, 52B and 52C. The external leads 17 and 18 are taken out of the casing member 9 through lead holes. The lead holes are sealed with rubber bushings 16. The push rod 13 is placed in the casing member 9 to bring the rod portion 14 into contact with the end surface 6T1 of the piezoelectric layer unit assembly 6 (the end surface 22A1 of the piezoelectric layer unit 2A). The conical springs 12 are fitted around the rod portion 15. The cap 10 is welded to the casing member 9, with the rod portion 15 passing through the insertion hole 10H of the cap 10, so as to hold the piezoelectric layer units 2A, 2B and 2C (the piezoelectric layer unit assembly 6) under compressive stress. The multilayer piezoelectric element 1 is then completed.

There is a possibility that the piezoelectric layer unit 2A, 2B, 2C itself and the piezoelectric layer unit assembly 6 may become curved and, in some cases, become buckled when the piezoelectric element 1 experiences a large impact force in the layer stacking direction ST due to e.g. a collision of the piezoelectric element 1 with any structural component. The interface portions between the piezoelectric layer units 2A and 2B and between the piezoelectric layer units 2B and 2C are most likely to become curved and buckled in the piezoelectric layer unit assembly 6. In the first embodiment, however, the positions of the piezoelectric layer units 2A, 2B and 2C within the casing member 9 along the layer plane direction VS are properly controlled by the contact portions 52A, 52B and 52C of the spacers 5A and 5B. It is thus possible to prevent curving and buckling of the piezoelectric layer unit 2 itself and the piezoelectric layer unit assembly 6 assuredly by contact of the spacer contact portions 52A, 52B and 52C with the inner cylindrical surface 9S of the casing member 9 at locations around the interfaces between the piezoelectric layer units 2A and 2B and between the piezoelectric layer units 2B and 2C even when the piezoelectric element 1 experiences a large impact force. The multilayer piezoelectric element 1 is consequently able to achieve high reliability and durability. It is also possible to minimize the number of the spacers 5 by arrangement of the spacers 5 around the interfaces between adjacent ones of the piezoelectric layer units 2.

In addition, the spacers 5 have not only the function of controlling the positional relationship of the piezoelectric layer units 2 with the casing member 9 along the layer plane direction VS but also the function of controlling the positional relationship of the electrode rods 42 and 45 with the piezoelectric layer units 2 and the casing member 9. The piezoelectric element 1 can attain a lower parts count, as compared to the case where piezoelectric layer unit positioning members and electrode rod positioning members are provided separately, and secure easy and assured insulation between the casing member 9 and the outer electrodes 24, 25 of the piezoelectric layer units 2 and between the casing member 9 and the electrical connection paths 41, 45.

Second Embodiment

A multilayer piezoelectric element of the second embodiment includes at least one piezoelectric layer unit 2 having sintered piezoelectric ceramic layers 2P and electrode layers 2E stacked alternately in a layer stacking direction ST as shown in FIGS. 3A and 3B and a positioning member that, when the at least one piezoelectric layer unit 2 is placed in an enclosing member in such a manner that the enclosing member encloses therewith a periphery of the at least one piezoelectric layer unit 2 along a layer plane direction VS (perpendicular to the layer stacking direction ST), controls the position of the at least one piezoelectric layer unit 2 along the layer plane direction VS within the enclosing member.

It is also likely that the at least one piezoelectric layer unit 2 will become curved to make a change in distance to the enclosing member and, in some cases, become buckled due to excessive curving as the dimension of the at least one piezoelectric layer unit 2 along the layer stacking direction ST increases. The curving and buckling of the at least one piezoelectric layer unit 2 is in particular likely to occur when the axis of the at least one piezoelectric layer unit 2 is misaligned with the axis of the enclosing member. In the second embodiment, however, the position of the at least one piezoelectric layer unit 2 within the enclosing member along the layer plane direction VS is properly controlled by the positioning member. It is therefore possible to prevent curving and buckling of the at least one piezoelectric layer unit 2 by contact of the positioning member with the enclosing member, even when an external force is applied in the layer stacking direction ST, and to provide the piezoelectric element with high reliability and durability.

The enclosing member can be any structural component such as a protection case (casing member) or a portion of any machine part and made in one or more pieces to enclose therewith the periphery of the at least piezoelectric layer unit 2 along the layer plane direction VS.

The positioning member may be kept in contact with or pressed against the at least one piezoelectric layer unit 2 at all times, or be brought into contact with or pressed against the at least one piezoelectric layer unit 2 at the time when the at least one piezoelectric layer unit 2 gets curved. The positioning member may also be kept in contact with or pressed against the enclosing member at all times or be brought into contact with or pressed against the enclosing member at the time when the at least one piezoelectric layer unit 2 gets curved. For example, the positioning member can be held in contact with or very close to an inner surface of the enclosing member and an outer peripheral surface of the at least one piezoelectric layer unit 2 so as to hold the at least one piezoelectric layer unit 2 in position within the enclosing member.

In order to place the at least one piezoelectric layer unit 2 in correct position to experience an external force, the positioning member is preferably designed to align the center 2X of the at least one piezoelectric layer unit 2 along the layer plane direction VS substantially with the axis of the enclosing member. It becomes possible to prevent curving and buckling of the at least one piezoelectric layer unit 2 more effectively by coaxial alignment of the at leas one piezoelectric layer unit 2 with the enclosing member, and then, impart higher reliability and durability to the piezoelectric element.

The positioning member is also preferably retained by the at least one piezoelectric layer unit 2 for easy and proper positioning of the at least at least one piezoelectric layer unit 2 in the enclosing member.

Further, the multilayer piezoelectric element of the second embodiment preferably includes a resinous (resin mold) member enclosing therewith the periphery of the at least one piezoelectric layer unit 2 along the layer plane direction VS with some portions of the positioning member exposed through an outer surface of the resin member. In order to protect the at least one piezoelectric layer units 2 from moisture, oil and external force, it is desirable to accommodate the at least one piezoelectric layer unit 2 in a casing member made of e.g. metal. When the at least one piezoelectric layer unit 2 is accommodated in the casing member, however, the piezoelectric element increases in size (outer diameter) and parts count. It is thus conceivable that the piezoelectric element be provided with no casing member and built in a machine part so that a portion of the machine part functions as the enclosing member, in place of the casing member. Even in such a case, there would arise demands for protection of the at least one piezoelectric layer unit 2 from moisture, oil and external force and for easy handling of the multilayer piezoelectric element. These demands can be satisfied with the use of the resinous member. As the contact portions of the positioning member are exposed through the resinous member, the position of the at least one piezoelectric layer unit 2 along the layer plane direction VS within the enclosing member can be controlled easily and properly by contact of the exposed portions of the positioning member with the enclosing member irrespective of the presence of the resinous member.

In the case where the multilayer piezoelectric layer element includes an assembly of a plurality of piezoelectric layer units 2, it is preferable to arrange the positioning member around each interface portion between adjacent piezoelectric layer units 2 and to allow the positioning member to align opposing ends of the adjacent piezoelectric layer units 2 substantially with each other for the same reasons as those of the first embodiment.

In the second embodiment, a resin-molded piezoelectric layer unit assembly 7 in which three piezoelectric layer units 2 (2A, 2B, 2C) and two spacers 5 (5A, 5B) are molded in a resin mold member 8 is used by itself as the multilayer piezoelectric element and installed into a fuel injector 110 as an actuator. The resin-molded piezoelectric layer unit assembly 7 of the second embodiment is structurally the same as that of the first embodiment. A detail explanation of the structure and production method of the resin-molded piezoelectric layer unit assembly 7 will be thus omitted.

Figure 13:
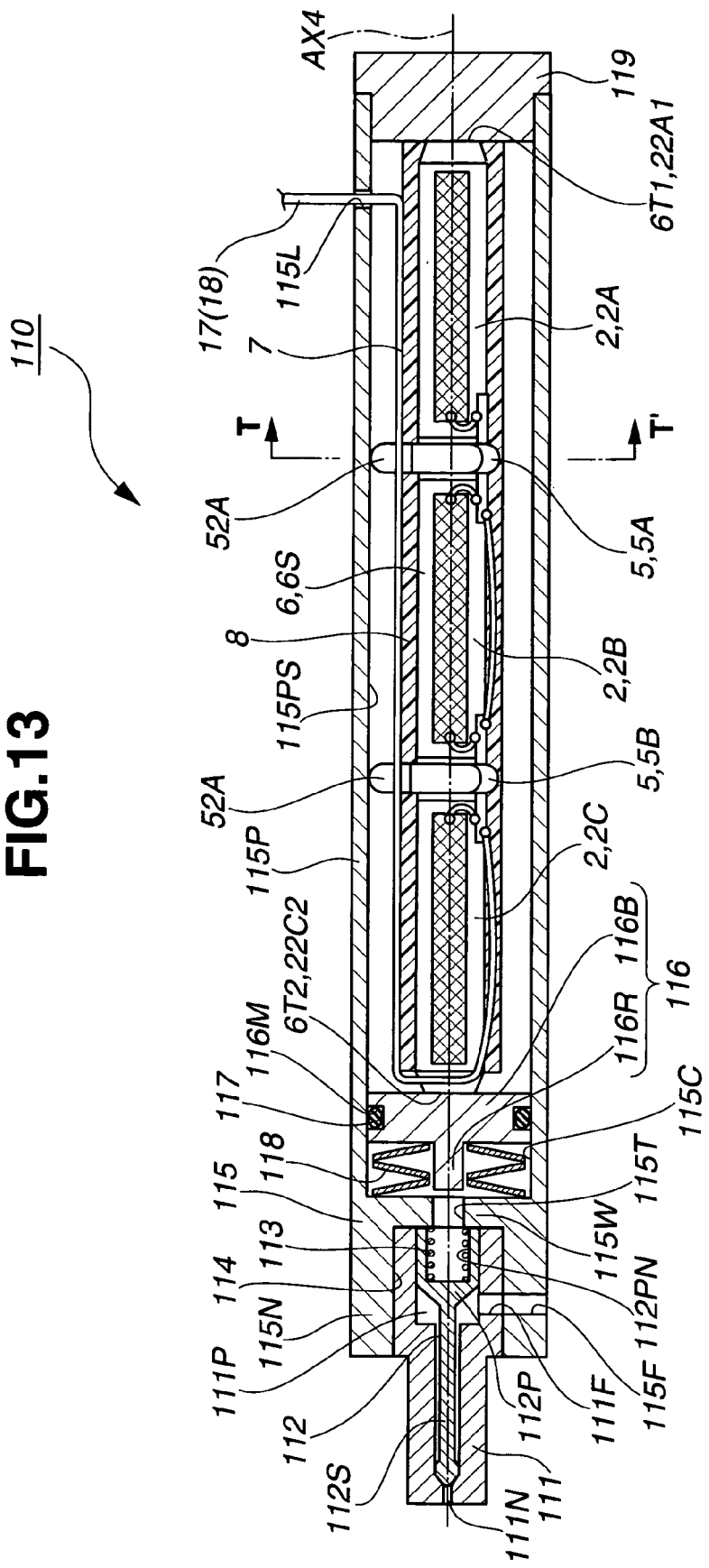
FIG. 13 is a sectional view of a fuel injector with a multilayer piezoelectric element according to the second embodiment of the present invention.

The fuel injector 110 is designed for high-pressure injection of fuel into a combustion chamber of an internal combustion engine and includes a substantially cylindrical injector body 115, a nozzle 111, a needle 112, a coil spring 113, a piston 116, a conical spring 118, a seal plate 119 and an O-ring 117 as shown in FIG. 13.

The injector body 115 extends along an axis AX4 and has a nozzle holding end portion 115N (on the left side in FIG. 13) for holding therein the nozzle 111, a cylindrical portion 115P (as the enclosing member) for enclosing a periphery of the piezoelectric layer unit assembly 7 along the layer plane direction VS to retain therein the piezoelectric layer unit assembly 7 and a partition wall 115W formed between the nozzle holding portion 115N and the cylindrical portion 115P.

The piston 116 is disposed in the cylindrical portion 115P of the injector body 115 and has a base portion 116B and a rod portion 116R smaller in diameter than the base portion 116B. The piston base portion 116B is held in contact with the end surface 6T2 of the piezoelectric layer unit assembly 7 (i.e. the end surface 22C2 of the piezoelectric layer unit 22C) so as to define a cylinder chamber 115C on the nozzle side of the base portion 116B. The rod portion 116R extends from the piston base portion 116R toward the nozzle 11 within the cylinder chamber 115C. A seal groove 116M is cut in an outer cylindrical surface of the piston base portion 116R. The O-ring 117 is fitted in the groove 116M to seal off the cylinder chamber 115C. The seal plate 119 is fitted in an opening end portion of the cylindrical portion 115P of the injector body 115 and held in contact with the end surface 6T1 of the piezoelectric layer unit assembly 7 (i.e. the end surface 22A1 of the piezoelectric layer unit 22A).

The conical spring 118 is fitted around the rod portion 116R of the piston 116 so as to apply a compressive stress to the piezoelectric layer unit assembly 7 by its spring tension at all times.

The nozzle 111 has a fuel injection hole 111N opened at an end thereof, and there is a cylinder chamber 111P defined in the piston side of the nozzle 111 such that the cylinder chamber 111P has a larger diameter than that of the fuel injection hole 111N.

The needle 112 is slidably disposed in the nozzle 111 so as to open and close the fuel injection hole 111N of the nozzle 111 by a tip end 112S of the needle 112. The needle 112 has a piston portion 112P arranged in the cylinder chamber 111P of the nozzle 111 to form an orifice 114 between an inner cylindrical surface of the cylinder chamber 111P and an outer cylindrical surface of the piston portion 112P. A spring holding hole 112PN is made in the piston portion 112P of the needle 112, and the coil spring 113 is fitted in the spring holding hole 112PN and held in contact with the partition wall 115W of the injector body 115 so as to bias the needle 112 toward the nozzle opening.

Further, fuel supply ports 115F and 111F are made in the injector body 115 and the nozzle 111, respectively, to provide a communication between the cylinder chamber 111P and the outside of the fuel injector 110 such that highly pressurized fuel is supplied into the cylinder chamber 111P through the fuel supply ports 115F and 111F. A communication hole 115T is also made in the partition wall 115W of the injector body 115 to provide a communication between the spring holding hole 112PN of the needle 112 and the cylindrical portion 115P of the injector body 115 so that the fuel is fed from the cylinder chamber 111P into the spring holding hole 112PN, the communication hole 115T and the cylinder chamber 115C of the injector body 115.

The external leads 17 and 18 of the piezoelectric layer unit assembly 7 are drawn out of the injector body 115 via lead insertion holes 115L.

The piezoelectric layer units 2A, 2B and 2C of the piezoelectric layer unit assembly 7 expand upon the application of a voltage between the external leads 17 and 18. The pressure in the cylinder chamber 115C becomes increased by the expansions of the piezoelectric layer units 2A, 2B and 2C such that the needle 112 moves to close the nozzle 111. When the piezoelectric layer units 2A, 2B and 2C contract by lowering the voltage between the external leads 17 and 18, the pressure in the cylinder chamber 115C becomes decreased to move the needle 112 under the fuel pressure supplied from the fuel supply ports 115F and 111F. The coil spring 13 then gets compressed to open the nozzle 111N.

The above-structured fuel injector 110 is attached to a ceiling wall of the combustion chamber with the nozzle 111 facing the combustion chamber so as to inject the fuel into the combustion chamber through the fuel injection hole 111N. It is noted that the fuel injector 110 (the piezoelectric layer unit assembly 7) is driven by means of a drive circuit, a control unit and a pulse generator. When the control unit determines a fuel injection amount based on intake air amount or revolution speed of the engine, the pulse generator generates a pulse signal corresponding to the fuel injection amount. A voltage responsive to the pulse signal is then applied to the fuel injector 110 (the piezoelectric layer unit assembly 7) through the drive circuit.

Herein, the positional relationship of the piezoelectric layer unit assembly 7 and the cylindrical portion 115P of the injector body 115 (as the enclosing member) in the fuel injector 110 will be explained below.

Figure 14:
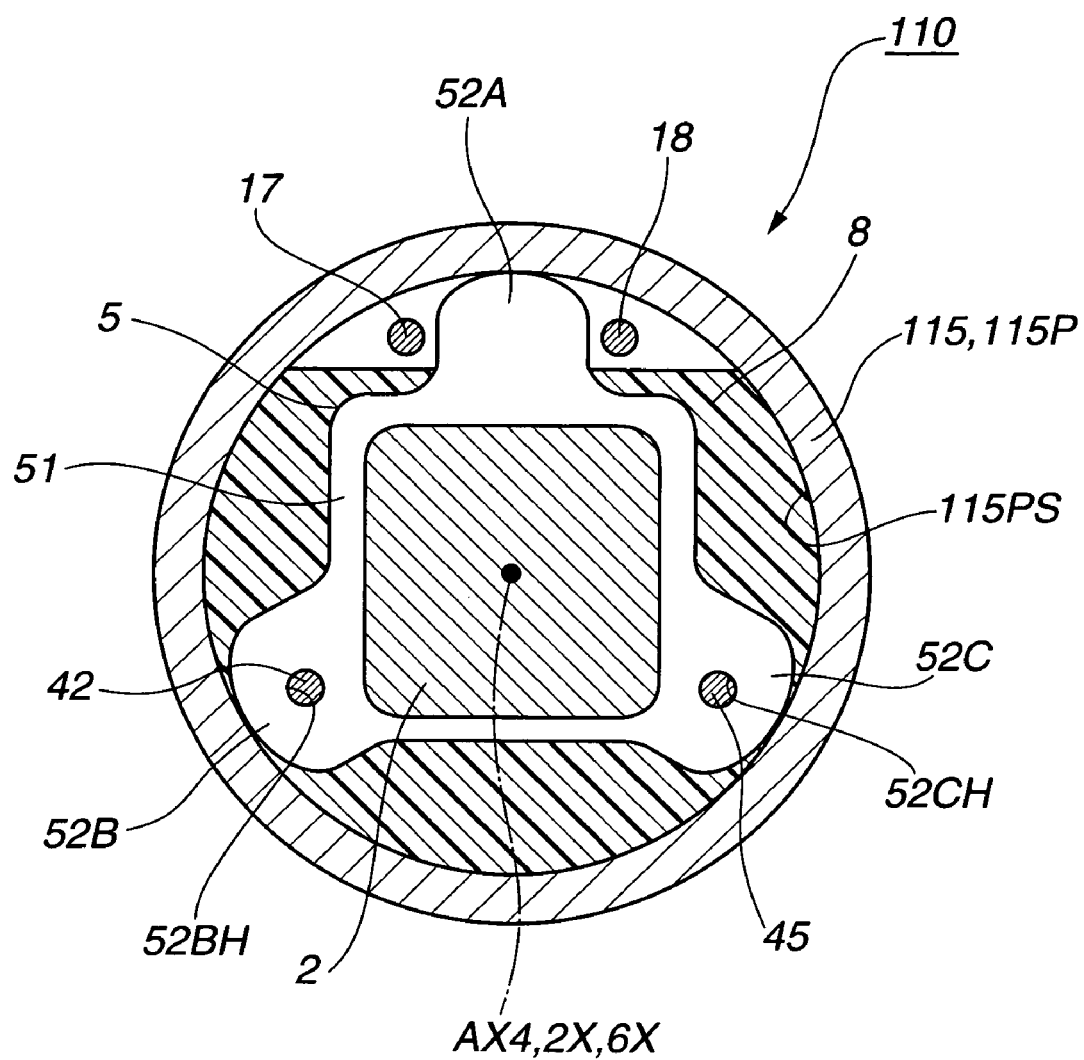
FIG. 14 is a sectional view of the fuel injector taken along a line T-T' of FIG. 13.

Each of the spacers 5A and 5B of the piezoelectric layer unit assembly 7 has three protruding contact portions 52A, 52B and 52C, whereas the inner cylindrical surface 115PS of the cylindrical portion 115P of the injector body 115 is substantially equal in diameter to a circle circumscribing the spacer contact portions 52A, 52B and 52C. Upon insertion of the piezoelectric layer unit assembly 7 in the cylindrical portion 115P of the injector body 115, the spacer contact portions 52A, 52B and 52C come into contact with or very close to the inner cylindrical surface 115PS of the cylindrical injector body portion 115P, as shown in FIG. 14, so as to roughly determine the positions of the spacers 5A and 5B within the cylindrical injector body portion 115P along the layer plane direction VS. By this, the piezoelectric layer unit assembly 7 is properly controlled within the cylindrical portion 115P of the injector body 115 in such a manner that each of the centers 2X of the piezoelectric layer units 2A, 2B and 2C (i.e. the center 6X of the piezoelectric layer unit assembly 6) along the layer plane direction VS is substantially in alignment with the axis AX4 of the cylindrical portion 115P of the injector body 115.

Even though there is a possibility that the piezoelectric layer unit 2A, 2B, 2C itself or the piezoelectric layer unit assembly 6 may become curved by the application of a large impact force to the piezoelectric layer unit assembly 7 in the layer stacking direction ST, it is thus possible in the second embodiment to prevent curving and buckling of the piezoelectric layer units 2A, 2B, 2C itself and the piezoelectric layer unit assembly 6 assuredly by contact of the spacer contact portions 52A, 52B and 52C with the inner cylindrical surface 115PS of the cylindrical injector body portion 115P. The fuel injector 110 is consequently able to achieve high reliability and durability.

Moreover, the electrical connection path 41 between the outer electrodes 24 of two adjacent piezoelectric layer units 2 is formed by the conductors 26, the electrode rod 42 and the electrode leads 43 in the piezoelectric layer unit assembly unit 7 in the second embodiment. The electrical connection path 44 between the outer electrodes 25 of two adjacent piezoelectric layer units 2 is also formed by the conductors 27, the electrode rod 45 and the electrode leads 46 in the piezoelectric layer unit assembly 7 in the second embodiment. These electrical connection paths 41 and 44 are capable of following the expansions and contractions of the piezoelectric layer units 2A, 2B and 2C because of flexibility of the electrode leads 43 and 46 and the terminals 26E and 27E of the conductors 26 and 27 while maintaining electrical connections between the outer electrodes 24 and between the outer electrodes 25. Further, the electrode rods 42 and 45 are retained in the contact portions 52B and 52C of the spacers 5, respectively, with some space left between the electrode rods 42, 45 and the outer surfaces 21 of the piezoelectric layer units 2. This makes it possible to prevent shorting and breaking of the electrical connection paths 41 and 44 as well as short circuit between the electrical connection paths 41 and 44 and between the electrical connection path 41, 44 and the other component.

It is needless to say that, at the time of assembling the piezoelectric layer units 2 and the spacers 5 with the use of the assembling jig AD and the molding jig MD in the second embodiment, the spacers 5 are also used to hold the piezoelectric layer units 2 in position within the jigs AD and MD for easy and proper assembling (stacking and bonding) of the piezoelectric layer units 2 and for easy and proper placement (molding) of the piezoelectric layer units 2 in the resin mold member 8. The assembling jig AD and the molding jig MD may have the same inner surface profiles as that of the injector body portion 115P (as the enclosing member), or may have different inner surface profiles that allow the spacer contact portions 52A, 52B and 52C to control the positions of the piezoelectric layer units 2 within the jigs AD and MD. The inner surface profile of the molding jig MD may be made smaller than that of the injector body portion 115P for ease of the resin-molded piezoelectric layer assembly 7 into the injector body portion 115P.

Third Embodiment

Figure 15A:
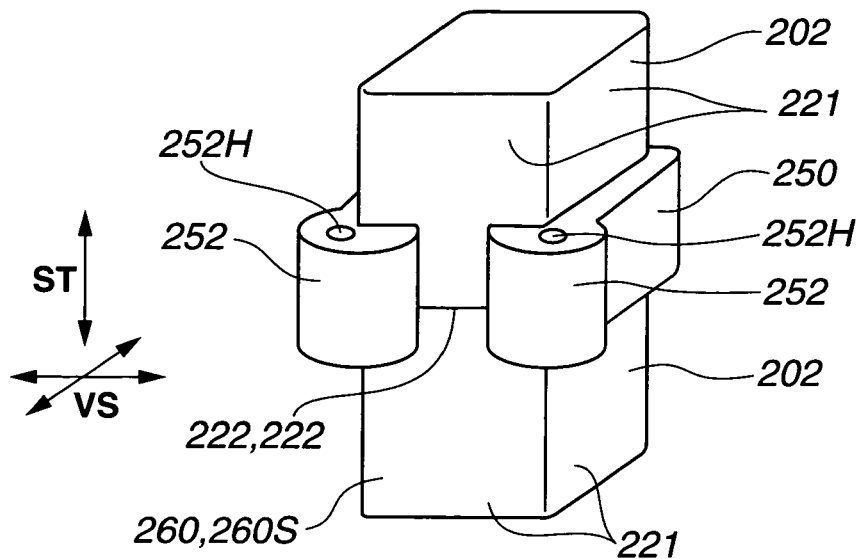
FIG. 15A is a perspective view of a piezoelectric layer unit assembly of a multilayer piezoelectric element according to a third embodiment of the present invention.
Figure 15B:
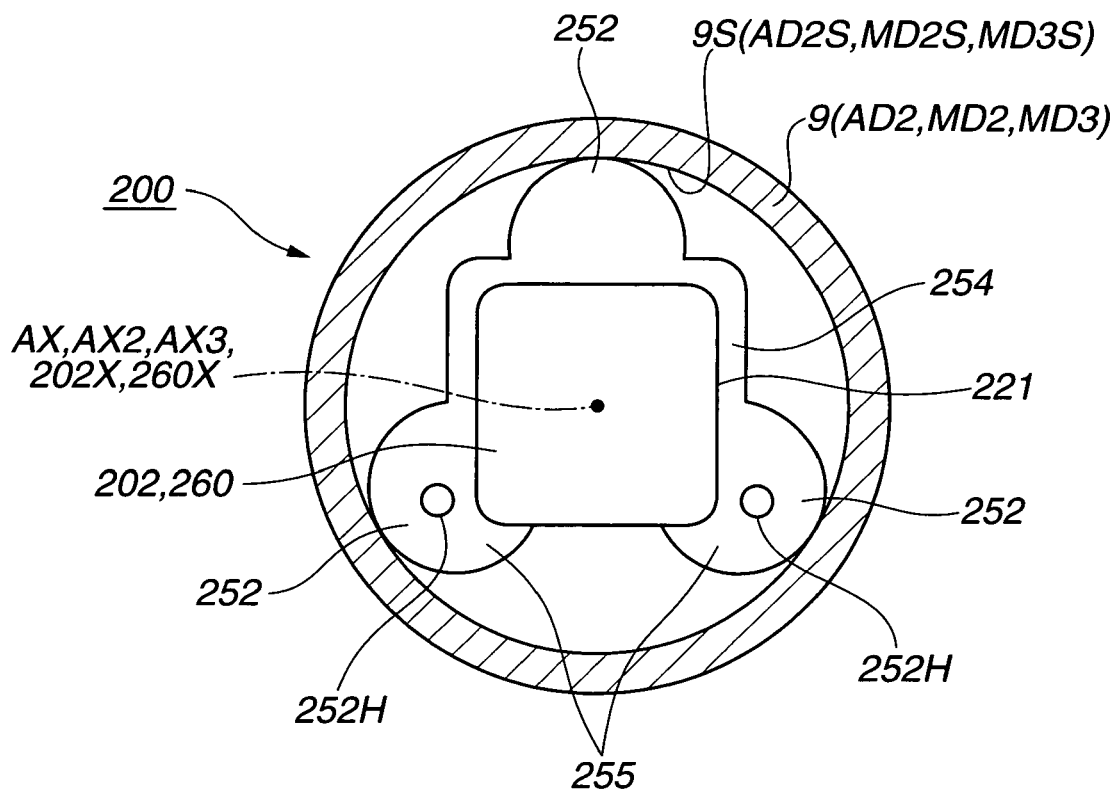
FIG. 15B is a sectional view of the piezoelectric layer unit assembly of FIG. 15A.
Figure 16A:
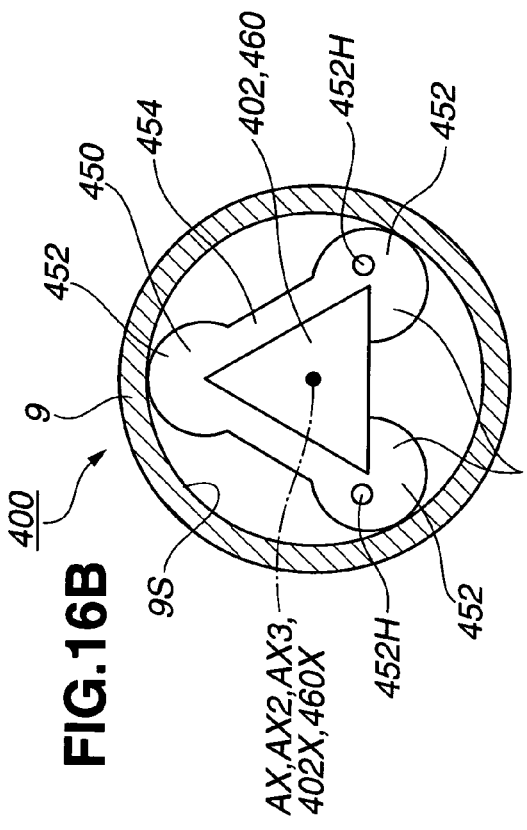
FIGS. 16A, 16B, 16C and 16D are sectional views of piezoelectric layer unit assemblies of multilayer piezoelectric elements according to fourth through seventh embodiments of the present invention, respectively.
Figure 16B:
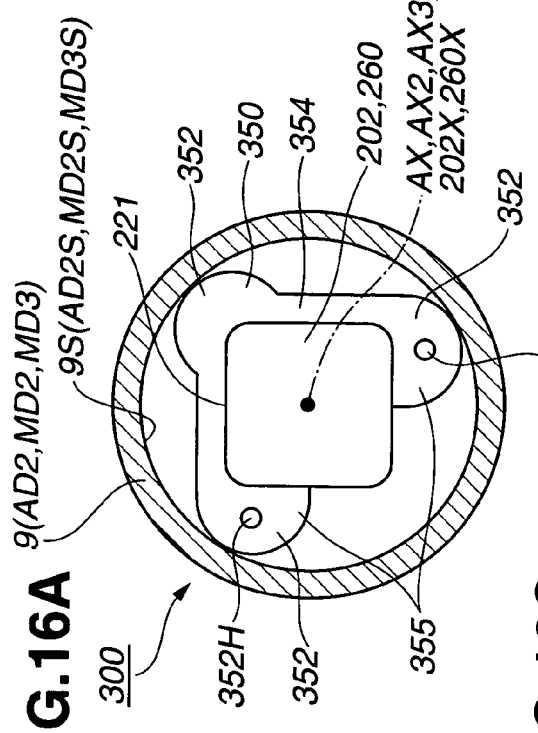
Figure 16C:
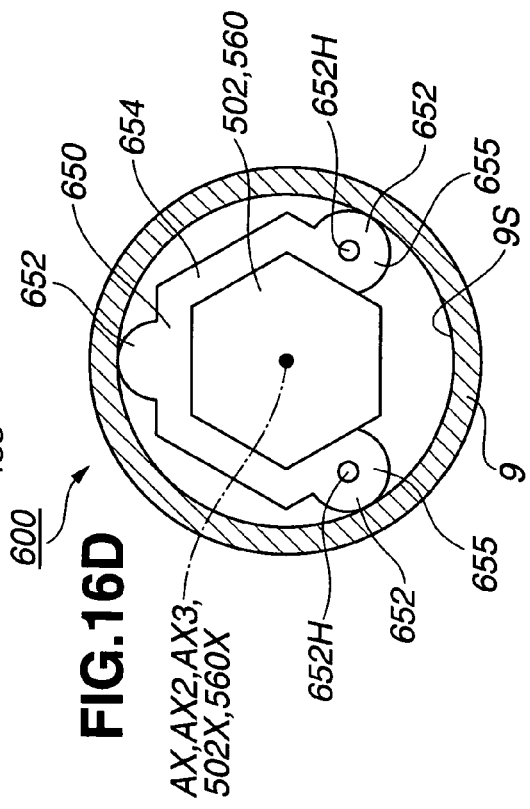
Figure 16D:
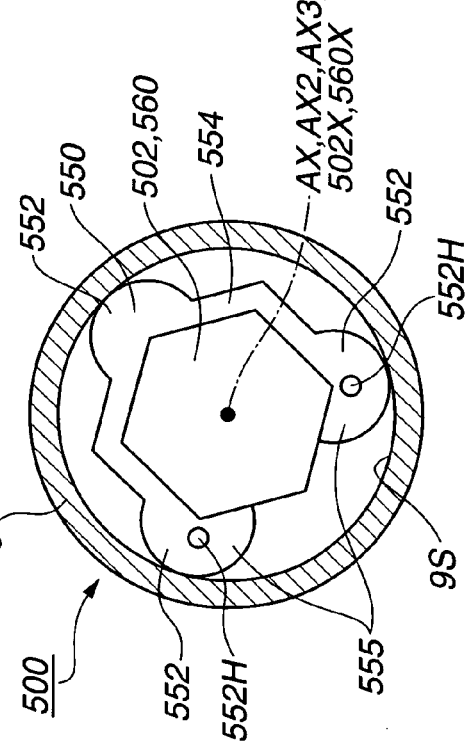

A multilayer piezoelectric element 200 of the third embodiment is structurally similar to the multilayer piezoelectric element 1 of the first embodiment and the multilayer piezoelectric element 7 of the second embodiment, except for the configuration of the positioning member. More specifically, the multilayer piezoelectric element 200 includes at least one piezoelectric layer unit 202 and at least one clip on type spacer 250 (as the positioning member) attached to the at least one piezoelectric layer unit 202. For purposes of explanation, two piezoelectric layer units 202 and one spacer 250 are schematically shown in FIGS. 15A and 15B.

The piezoelectric layer units 202 of the third embodiment are structurally similar to the piezoelectric layer units 2 of the first and second embodiments and have sintered piezoelectric ceramic layers and electrode layers alternately stacked together in the layer stacking direction ST. Each of the piezoelectric layer units 202 is formed into a substantially rectangular parallelepiped shape with a pair of end surfaces 222 and four side surfaces 221. The opposite ends of the piezoelectric layer units 202 are not chamfered, but the edges of the piezoelectric layer units 202 along the layer stacking direction ST are rounded.

The spacer 250 has a substantially C-shaped (or U-shaped) holding portion 254 formed with two cut ends 255 and fitted around the piezoelectric layer units 202 so as to extend across three or more of the side surfaces 221 of the piezoelectric layer units 202 and thereby elastically hold therein the piezoelectric layer units 202. The spacer 250 also has protruding contact portions 252 formed on the ends 255 of the holding portion 254 and the center of the holding portion 254 so as to protrude from the holding portion 254. Each of the contact portions 252 is shaped like a nearly a three-quarter column or semi column. Electrode rod insertion holes 252H are formed through two of the contact portions 252 on the ends 255 of the holding portion 254.

With such a configuration, the spacer 250 can be easily attached at any time to the appropriate peripheral portions of the piezoelectric layer units 202 to prevent the piezoelectric layer units 202 from curving and buckling effectively, by elastically opening up a space between the ends 225 of the holding portion 254 and then clipping the spacer 250 on the piezoelectric layer units 202 in the layer plane direction VS. The spacer 250 is preferably fitted around the interface portion between the opposed end surfaces 222 of two adjacent piezoelectric layer units 202 as shown in FIG. 15A. For example, an assembly 260S of the piezoelectric layer units 202 and the spacer 205 can obtained by clipping the spacer 250 on the piezoelectric layer units 202 to align the piezoelectric layer units 202 into an assembly 260, and then, bonding the piezoelectric layer units 202 and the spacer 250 together by adhesive curing.

As shown in FIG. 15B, the spacer contact portions 252 comes into contact with or very close to the inner cylindrical surface 9S of the casing member 9 since the inner cylindrical surface 9S of the casing member 9 is substantially equal in diameter to a circle circumscribing the contact portions 252. The position of the spacer 250 along the layer plane direction VS is roughly determined upon placement of the piezoelectric layer unit assembly 6S in the casing member 9. The piezoelectric layer units 202 are then properly positioned within the casing member 9 in such a manner that the centers 202X of the piezoelectric layer units 202 along the layer plane direction VS (the center 260X of the piezoelectric layer unit assembly 260 along the layer plane direction VS) is substantially in alignment with the axis AX of the casing member 9.

The curving and buckling of the piezoelectric layer units 202 can be thus prevented by contact of the spacer contact portions 252 with the inner surface 9S of the casing member 9 even when the piezoelectric element 200 experiences a large impact force in the layer stacking direction ST. The multilayer piezoelectric element 200 is consequently able to achieve high reliability and durability.

In the third embodiment, the piezoelectric layer unit assembly 260S can be produced in the same manner using the assembling jig AD as in the first embodiment. A resin mold member may also be provided in the second embodiment, although not so shown in the drawings, in the same manner using the molding jig MD as in the first embodiment. In these cases, it is possible to determine the positional relationships of the piezoelectric layer units 202 along the layer plane direction VS with an inner surface AD2 of the cylindrical jig member AD2 of the assembling jig AD and an inner surface AD3 of the cylindrical members MD2, MD3 of the molding jig MD, by means of the spacer contact portions 252, in such a manner that each of the axes 202X of the piezoelectric layer units 202 (the axis 260X of the piezoelectric layer unit assembly 260) is substantially in alignment with the axis AX2 of the cylindrical member AD2 of the assembling jig AD or the axis AD3 of the cylindrical members MD2, MD3 of the molding jig MD.

Fourth to Seventh Embodiments

Multilayer piezoelectric elements 300, 400, 500 and 600 of the fourth to seventh embodiments are structurally similar to the multilayer piezoelectric element 200 of the third embodiment, except for the piezoelectric layer unit configurations and/or the spacer configurations.

The multilayer piezoelectric element 300 includes at least one piezoelectric layer unit 202 and at least one clip on type spacer 350 (as the positioning member). Although the piezoelectric layer unit 202 of the multilayer piezoelectric element 300 is of the same shape (rectangular parallelepiped shape) as that of the multilayer piezoelectric element 200, the spacer 350 is different is shape from the spacer 250.

The multilayer piezoelectric element 400 includes at least one triangular prism shaped piezoelectric layer unit 402 and at least one clip on type spacer 450 (as the positioning member) shaped to fit around the at least one piezoelectric layer unit 402.

The multilayer piezoelectric element 500 includes at least one hexagonal prism shaped piezoelectric layer unit 502 and at least one clip on type spacer 550 (as the positioning member) shaped to fit around the at least one piezoelectric layer unit 502.

The multilayer piezoelectric element 600 includes at least one piezoelectric layer unit 502 and at least one clip on type spacer 650 (as the positioning member) shaped to fit around the at least one piezoelectric layer unit 502. The piezoelectric layer unit 502 of the multilayer piezoelectric element 600 is of the same shape as that of the multilayer piezoelectric element 500, but the spacer 650 is different is shape from the spacer 550.

More specifically, the spacers 350, 450, 550 and 650 have substantially C-shaped (or V-shaped) holding portions 354, 454, 554 and 654 formed with cut ends 355, 455, 555 and 655 and fitted around the piezoelectric layer units 202, 402, 502 so as to extend across the great parts of the peripheries of the piezoelectric layer units 202, 402, 502 and thereby elastically hold therein the piezoelectric layer units 202, 402, 502, respectively. The spacers 350, 450, 550 and 650 also have protruding contact portions 352, 452, 552 and 652 formed on the ends 355, 455, 555 and 655 of the holding portions 354, 454, 554 and 654 and the centers of the holding portions 354, 454, 554 and 654 so as to protrude from the holding portions 354, 454, 554 and 654, respectively. The contact portions 352, 452, 552, 652 are formed into nearly three-quarter column shapes or semi column shapes.

With such configurations, the spacers 350, 450, 550 and 650 can be easily attached to the appropriate peripheral portions of the piezoelectric layer units 202, 402 and 502 at any time by elastically opening up the respective spaces between the ends 355, 455, 555 and 655 of the holding portion 354, 454, 554 and 654 and then clipping the spacers 350, 450, 550 and 650 on the piezoelectric layer units 202, 402 and 502 in the layer plane direction. The piezoelectric layer units 202, 402, 502 can be aligned with each other and combined into unit assembly 260, 460, 560 upon attachment of the spacer 350, 450, 550, 650 around the interface portion between the adjacent piezoelectric layer units 202, 402, 602. Further, electrode rod insertion holes 352H, 452H, 552H and 652H are formed through the contact portions 352, 452, 552 and 652 on the ends 355, 455, 555 and 655 of the holding portions 354, 454, 554 and 654, respectively, so that electrode rods are retained in the holes 352H, 452H, 552H, 652H of the spacer contact portions 352, 452, 552, 652 to provide electrical connection paths between the outer electrodes of any adjacent piezoelectric layer units 202, 402, 502.

As shown in FIGS. 16A, 16B, 16C and 16D, the spacer contact portions 352, 452, 552, 652 come contact with or very close to the inner cylindrical surface 9S of the casing member 9 since the inner cylindrical surface 9S of the casing member 9 is substantially equal in diameter to a circle circumscribing the contact portions 352, 452, 552, 652. The position of the spacer 350, 450, 550, 650 along the layer plane direction VS is roughly determined upon placement of the piezoelectric layer unit assembly in the casing member 9. The piezoelectric layer units 202, 402, 502 along the layer plane direction VS are then properly positioned in such a manner that each of the centers 202X, 402X, 502X of the piezoelectric layer units 202, 402, 502 along the layer plane direction VS (the center 260X, 460X, 560X of the piezoelectric layer unit assembly 260, 460, 560 along the layer plane direction VS) is substantially in alignment with the axis AX of the casing member 9.

The curving and buckling of the piezoelectric layer units 202, 402, 502 can be thus prevented assuredly by contact of the spacer contact portions 352, 452, 552, 652 with the inner cylindrical surface 9S of the casing member 9 even when the piezoelectric element 300, 400, 500, 600 experiences a large impact force in the layer stacking direction. The multilayer piezoelectric element 300, 400, 500 and 600 are consequently able to achieve high reliability and durability.

In the forth to seventh embodiments, the piezoelectric layer units 202, 402, 502 and the spacer 350, 450, 550, 650 can be assembled in the same manner using the assembling jig AD as in the first and second embodiments. A resin mold member may be provided in each of the fourth to seventh embodiments, although not so shown in the drawings, in the same manner using the molding jig MD as in the first and second embodiments. In these cases, it is possible to determine the positional relationships of the piezoelectric layer units 202, 402 and 502 along the layer plane direction VS with the inner surface AD2 of the cylindrical member AD2 of the assembling jig AD or the inner surface AD3 of the cylindrical members MD2, MD3 of the molding jig MD, by means of the spacer contact portions 352, 452, 552 and 652, in such a manner that each of the axes 202X, 402X, 502X of the piezoelectric layer units 202, 402, 502 (the axis 260X, 460X, 560X of the piezoelectric layer unit assembly 260, 460, 560) is substantially in alignment with the axis AX2 of the cylindrical member AD2 of the assembling jig AD or the axis AD3 of the cylindrical members MD2, MD3 of the molding jig MD.

The entire contents of Japanese Patent Application No. 2005-085716 (filed on Mar. 24, 2005) and No. 2006-030157 (filed on Feb. 7, 2006) are herein incorporated by reference.

Although the present invention has been described with reference to the above first to seventh embodiments of the invention, the invention is not limited to these embodiments. Various modification and variation of the embodiments described above will occur to those skilled in the art in light of the above teaching.

For example, the piezoelectric element 1, 200, 300, 400, 500 or 600 may be installed into the fuel injector 110 in place of the piezoelectric element 7.

One or more spacers 5, 250, 350, 450, 550, 650 may alternatively be attached to each piezoelectric layer unit 2, 202, 402, 502 to control the position of the piezoelectric layer unit 2, 202, 402, 502 along the layer plane direction VS although the spacer 5, 250, 350, 450, 550, 650 is attached to the interface portion between two adjacent piezoelectric layer units 2, 202, 402, 502 in the above embodiments.

Although each of the spacers 5, 250, 350, 450, 550 and 650 has three contact portions 52, 252, 352, 452, 552, 652 in the above embodiments, the number of the spacer contact portions 52, 252, 352, 452, 552, 652 is not limited to three. The spacer 5, 250, 350, 450, 550, 650 can be provided with an appropriate number of contact portions 52, 252, 352, 452, 552, 652 to control the position of the piezoelectric layer unit 2, 202, 402, 502 and to prevent the piezoelectric layer unit 2, 202, 402, 502 in view of the shape of the casing member 9 or the enclosing member 115P.

The piezoelectric layer unit assembly 6, 260, 460, 560 may alternatively include two or more than three piezoelectric layer units 2, 202, 402, 502.

Each of the casing member 9, the injector body 115, the jig member AD2 of the assembling jig AD and the molding members MD2, MD3 of the molding jig MD can be formed into another shape such as a square tube shape although these members 9, 115, AD2, MD2 and MD3 are cylindrical in shape in the above embodiments. Even this case, it is possible to prevent curving and buckling of the piezoelectric layer units 2, 202, 402 and 502 when the spacers 5, 250, 350, 450, 550 and 650 are shaped in such a manner as to allow the contact portions 52, 252, 352, 452, 552 and 652 to properly control the positions of the piezoelectric layer units 2, 202, 402 and 502 along the layer plane direction VS within the casing member 9, the injector body 115, the jig member AD2 of the assembling jig AD and the molding members MD2, MD3 of the molding jig MD.

The scope of the invention is defined with reference to the following claims.

What is claimed is:

1. A multilayer piezoelectric element, comprising:
    at least one piezoelectric layer unit having sintered piezoelectric ceramic and electrode layers alternately stacked together in a first direction;
    a casing member that encloses therewith a periphery of said at least one piezoelectric layer unit along a second direction perpendicular to the first direction;
    a positioning member that controls the position of said at least one piezoelectric layer unit within the casing member along the second direction; and
    a resin member enclosing therewith the periphery of said at least one piezoelectric layer unit along the second direction,
    wherein the positioning member has contact portions exposing through an outer peripheral surface of the resin member to control the position of said at least one piezoelectric layer unit by contact of the contact portions with the casing member.

2. The multilayer piezoelectric element according to claim 1, wherein the positioning member aligns a center of the at least one piezoelectric layer unit along the second direction substantially with an axis of the casing member.

3. The multilayer piezoelectric element according to claim 1, wherein the positioning member is retained by said at least one piezoelectric layer unit.

4. The multilayer piezoelectric element according to claim 1, wherein said at least one piezoelectric layer unit includes piezoelectric layer units stacked together in the first direction; and wherein the positioning member is located around each interface between two adjacent ones of the piezoelectric layer units.

5. The multilayer piezoelectric element according to claim 4, wherein the positioning member aligns the positions of opposing ends of said adjacent ones of the piezoelectric layer units along the second direction substantially with each other.

6. The multilayer piezoelectric element according to claim 1, wherein the positioning member includes a holding portion that elastically holds therein said at least one piezoelectric layer unit.

7. A multilayer piezoelectric element, comprising:
    at least one piezoelectric layer unit having sintered piezoelectric ceramic and electrode layers alternately stacked together in a first direction;
    a positioning member that, when said at least one piezoelectric layer unit is placed in an enclosing member in such a manner that the enclosing member encloses therewith a periphery of said at least one piezoelectric layer unit along a second direction perpendicular to the first direction, controls the position of said at least one piezoelectric layer unit within the enclosing member along the second direction; and
    a resin member enclosing therewith the periphery of said at least one piezoelectric layer unit along the second direction,
    wherein the positioning member has contact portions exposing through an outer peripheral surface of the resin member to control the position of said at least one piezoelectric layer unit by contact of the contact portions with the casing member.

8. The multilayer piezoelectric element according to claim 7, wherein the positioning member aligns a center of the at least one piezoelectric layer unit along the second direction substantially with an axis of the enclosing member.

9. The multilayer piezoelectric element according to claim 7, wherein the positioning member is retained by said at least one piezoelectric layer unit.

10. The multilayer piezoelectric element according to claim 7, wherein said at least one piezoelectric layer unit includes piezoelectric layer units stacked together in the first direction; and wherein the positioning member is located around each interface between two adjacent ones of the piezoelectric layer units.

11. The multilayer piezoelectric element according to claim 10, wherein the positioning member aligns the positions of opposing ends of said adjacent ones of the piezoelectric layer units along the second direction substantially with each other.

12. The multilayer piezoelectric element according to claim 7, wherein the positioning member includes a holding portion that elastically holds therein said at least one piezoelectric layer unit.

13. A fuel injector, comprising:
- a multilayer piezoelectric element that includes at least one piezoelectric layer unit having sintered piezoelectric ceramic layers and electrode layers alternately stacked in a first direction;
- an enclosing member that encloses therewith a periphery of said at least one piezoelectric layer unit along a second direction perpendicular to the first direction;
- a positioning member that controls the position of said at least one piezoelectric layer unit within the enclosing member along the second direction; and
- a resin member enclosing therewith the periphery of said at least one piezoelectric layer unit along the second direction,
- wherein the positioning member has contact portions exposing through an outer peripheral surface of the resin member to control the position of said at least one piezoelectric layer unit by contact of the contact portions with the casing member.

14. A method of producing a multilayer piezoelectric element,
said multilayer piezoelectric element comprising:
- at least one piezoelectric layer unit having sintered piezoelectric ceramic and electrode layers alternately stacked together in a first direction;
- a positioning member that, when said at least one piezoelectric layer unit is placed in an enclosing member in such a manner that the enclosing member encloses therewith a periphery of said at least one piezoelectric layer unit along a second direction perpendicular to the first direction, controls the position of said at least one piezoelectric layer unit within the enclosing member along the second direction; and
- a resin member enclosing therewith the periphery of said at least one piezoelectric layer unit along the second direction,
- wherein the positioning member has contact portions exposing through an outer peripheral surface of the resin member to control the position of said at least one piezoelectric layer unit by contact of the contact portions with the casing member;

said method comprising:
- providing at least one piezoelectric layer unit having sintered piezoelectric ceramic layers and electrode layers alternately stacked together in a first direction;
- attaching a positioning member to said at least one piezoelectric layer unit to form a unit assembly;
- forming a resin member around the periphery of said at least one piezoelectric layer unit with contact portions of the positioning member exposing through an outer peripheral surface of the resin member; and
- inserting the unit assembly into an enclosing member in such a manner as that the enclosing member encloses therewith a periphery of the unit assembly along a second direction perpendicular to the first direction, while allowing the positioning member to control the position of said at least one piezoelectric layer unit within the enclosing member along the second direction by contact of the contact portions with the enclosing member.

15. A method of producing a multilayer piezoelectric element,
said multilayer piezoelectric element comprising:
- at least one piezoelectric layer unit having sintered piezoelectric ceramic and electrode layers alternately stacked together in a first direction;
- a positioning member that, when said at least one piezoelectric layer unit is placed in an enclosing member in such a manner that the enclosing member encloses therewith a periphery of said at least one piezoelectric layer unit along a second direction perpendicular to the first direction, controls the position of said at least one piezoelectric layer unit within the enclosing member along the second direction; and
- a resin member enclosing therewith the periphery of said at least one piezoelectric layer unit along the second direction,
- wherein the positioning member has contact portions exposing through an outer peripheral surface of the resin member to control the position of said at least one piezoelectric layer unit by contact of the contact portions with the casing member;

said method comprising:
- providing piezoelectric layer units each having sintered piezoelectric ceramic layers and electrode layers alternately stacked together in a first direction;
- stacking the piezoelectric layer units together in the first direction with an uncured adhesive material being interposed between opposing end surfaces of adjacent ones of the piezoelectric layer units;
- curing the adhesive material to bond the piezoelectric layer units together;
- arranging a positioning member on the piezoelectric layer units in such a manner that, when the piezoelectric layer units are placed in an enclosing member so that the enclosing member encloses therewith peripheries of the piezoelectric layer units along a second direction perpendicular to the first direction, the positioning member has contact portions brought into contact with the enclosing member to control the positions of the piezoelectric layer units within the enclosing member along the second direction; and
- forming a resin member around the peripheries of the piezoelectric layer units with the contact portions of the positioning member exposing through an outer peripheral surface of the resin member,
- wherein said stacking includes inserting the piezoelectric layer units and the positioning member in an assembling jig in such a manner that the assembling jig encloses therewith peripheries of the piezoelectric layer units along the second direction, while allowing the positioning member to control the positions of the piezoelectric layer units within the assembling jig along the second direction.

16. The method according to claim 15, wherein said arranging is done simultaneously with said stacking.

17. A method of producing a multilayer piezoelectric element,
said multilayer piezoelectric element comprising:
- at least one piezoelectric layer unit having sintered piezoelectric ceramic and electrode layers alternately stacked together in a first direction;
- a positioning member that, when said at least one piezoelectric layer unit is placed in an enclosing member in such a manner that the enclosing member encloses therewith a periphery of said at least one piezoelectric layer unit along a second direction perpendicular to the first direction, controls the position of said at least one piezoelectric layer unit within the enclosing member along the second direction; and a resin member enclosing therewith the periphery of said at least one piezoelectric layer unit along the second direction, wherein the positioning member has contact portions exposing through an outer peripheral surface of the resin member to control the position of said at least one piezoelectric layer unit by contact of the contact portions with the casing member;

said method comprising:

providing at least one piezoelectric layer unit having sintered piezoelectric ceramic layers and electrode layers alternately stacked in a first direction;

attaching a positioning member to said at least one piezoelectric layer unit in such a manner that, when said at least one piezoelectric layer unit is placed in an enclosing member so that the enclosing member encloses therewith a periphery of said at least one piezoelectric layer unit along a second direction perpendicular to the first direction, the positioning member has contact portions brought into contact with the enclosing member to control the position of said at least one piezoelectric layer unit within the enclosing member along the second direction; and forming a resin mold member around the periphery of said at least one piezoelectric layer unit along the second direction with the contact portions of the positioning member exposing through an outer peripheral surface of the resin member, wherein said forming includes:

inserting said at least one piezoelectric layer unit and the positioning member in a molding jig, while allowing the positioning member to control the position of said at least one piezoelectric layer unit within the molding jig along the second direction; and molding a resinous material into a space between an outer surface of said at least one piezoelectric layer unit and an inner surface of the molding jig.

* * * * *